United States Patent
Umehara et al.

(10) Patent No.: US 7,820,006 B2
(45) Date of Patent: Oct. 26, 2010

(54) DIE PICKUP APPARATUS FOR PICKING UP SEMICONDUCTOR DIES AND METHODS FOR PICKING UP SEMICONDUCTOR DIES

(75) Inventors: Okito Umehara, Tokyo (JP); Kuniyuki Takahashi, Tokyo (JP)

(73) Assignee: Shinkkawa Ltd., Tokyo (JP)

( * ) Notice: Subject to any disclaimer, the term of this patent is extended or adjusted under 35 U.S.C. 154(b) by 0 days.

(21) Appl. No.: 12/714,615

(22) Filed: Mar. 1, 2010

(65) Prior Publication Data
US 2010/0226745 A1 Sep. 9, 2010

(30) Foreign Application Priority Data
Mar. 5, 2009 (JP) .............................. 2009-051485

(51) Int. Cl.
B32B 38/10 (2006.01)
(52) U.S. Cl. .................. 156/344; 156/584; 438/464; 438/976
(58) Field of Classification Search ............ 156/344, 156/584; 438/464, 976
See application file for complete search history.

(56) References Cited

U.S. PATENT DOCUMENTS

| 6,561,743 B1 | 5/2003 | Nakatsu |
| 7,238,593 B2 * | 7/2007 | Medding et al. ........... 438/464 |
| 2002/0129899 A1 * | 9/2002 | Mimata et al. ............. 156/344 |
| 2005/0255673 A1 * | 11/2005 | Cheung et al. ............. 438/460 |
| 2009/0075459 A1 | 3/2009 | Sato et al. |
| 2009/0101282 A1 | 4/2009 | Fujino et al. |
| 2010/0038031 A1 * | 2/2010 | Koike ....................... 156/344 |

FOREIGN PATENT DOCUMENTS

| JP | 2001-118862 | 4/2001 |
| JP | 3209736 | 7/2001 |
| JP | 2006-156806 | 6/2006 |
| JP | 4215818 | 11/2008 |
| WO | 2008004270 | 1/2008 |
| WO | 2009/136450 | 11/2009 |
| WO | 2010/001497 | 1/2010 |

OTHER PUBLICATIONS

International Search Report dated Oct. 13, 2009, from the corresponding International Application.

* cited by examiner

*Primary Examiner*—Mark A Osele
(74) *Attorney, Agent, or Firm*—Katten Muchin Roseman LLP

(57) ABSTRACT

A die pickup apparatus facilitates picking up a semiconductor die in a manner such that, in a state in which a semiconductor die to be picked up is suctioned by a collet, a frontal end of a cover plate is caused to extend from a contact surface, and the cover plate is caused to slide while pushing up a dicing sheet and the semiconductor die, and subsequently a rear end of the cover plate is caused to extend from the contact surface such that an upper surface of the cover plate is substantially in parallel with the contact surface, the cover plate is caused to slide while pushing the dicing sheet and the semiconductor die with the upper surface of the cover plate such that the suction opening is opened, and the dicing sheet is suctioned into the opened suction opening, thereby separating the dicing sheet.

11 Claims, 14 Drawing Sheets

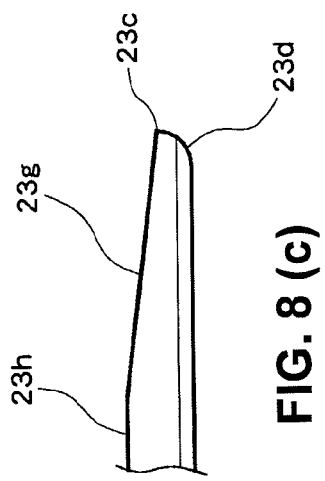
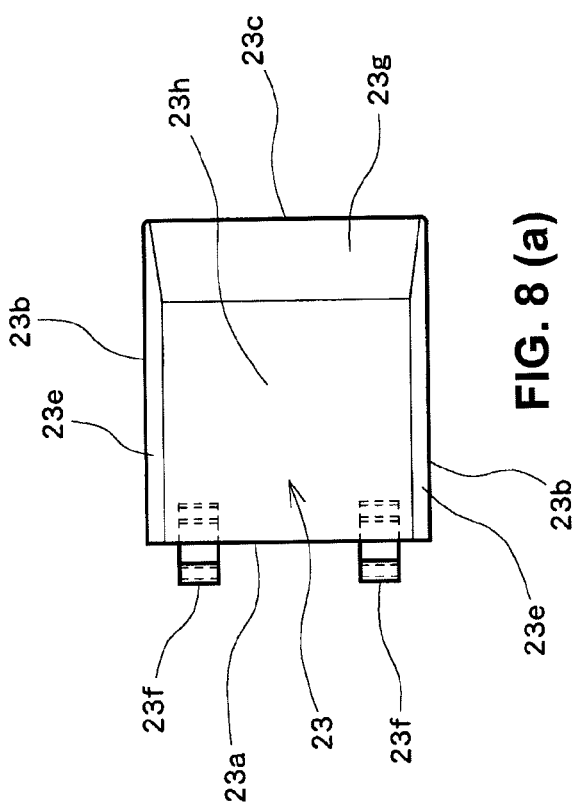
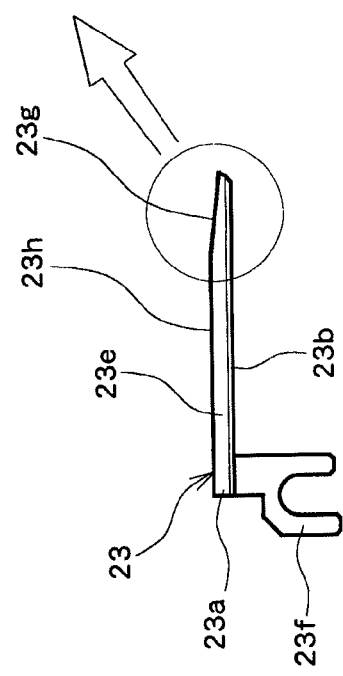

DIE PICKUP APPARATUS FOR PICKING UP SEMICONDUCTOR DIES AND METHODS FOR PICKING UP SEMICONDUCTOR DIES

BACKGROUND OF THE INVENTION

1. Field of the Invention

The present invention relates to structures of a die pickup apparatus for picking up semiconductor dies and methods for picking up semiconductor dies.

2. Description of Related Art

Semiconductor dies are typically manufactured by dicing a wafer of 6 or 8 inches into dies of a predetermined size. When dicing a wafer, an adhesive dicing tape is attached on a back surface of the wafer so as to prevent the manufactured semiconductor dies from falling apart, and then the wafer is cut from the other side using such as a dicing saw. At this time, the dicing tape attached to the back surface of the wafer is slightly cut into its surface but not entirely cut off, and the semiconductor dies remain held on the tape. Then, the individual semiconductor dies are picked up one by one from the dicing tape and transferred to a subsequent step such as a die bonding step.

Conventionally, a method using a push-up needle is widely employed as a method of picking up semiconductor dies from an adhesive dicing tape (see FIG. 15 of Japanese Patent No. 3209736, for example). According to this method, semiconductor dies are picked up using a collet in such a manner that a semiconductor die is pushed upward in its center by a push-up needle under a dicing sheet to which a tensile force is exerted toward its periphery while the semiconductor die is suctioned by a collet, and thus the semiconductor die is separated from the adhesive dicing sheet by the tensile force exerted to the dicing sheet.

However, this method of using the push-up needle has become less suitable for picking up low-profile semiconductor dies of recent years, because the method poses a problem that the pushing up can break the semiconductor dies when the dies are made thin.

To address this issue, methods have been proposed with which semiconductor dies are removed and picked up from an adhesive dicing sheet without using a push-up needle. For example, Japanese Patent No. 3209736 proposes a method including: placing a semiconductor die to be picked up over a plurality of suction holes provided for a stage; producing vacuum in the plurality of suction holes to deform a dicing sheet by suctioning the sheet into the suction holes while the semiconductor die is suction-held by a collet; separating the dicing sheet corresponding to the suction holes from the semiconductor die; and then separating the remaining portion of the dicing sheet from the semiconductor die by moving the stage horizontally or rotationally (see FIG. 1 through FIG. 4 of Japanese Patent No. 3209736).

Japanese Patent No. 3209736 also proposes a different method including: providing a projection on a surface of the stage, the projection having a width narrower than that of a semiconductor die to be picked up; providing suction holes that surround the projection on the surface of the stage; when picking up a semiconductor die, placing a semiconductor die to be picked up over the projection so as to cover an area larger than the projection and suction-holding the semiconductor die to be picked by a collet; suctioning the dicing sheet downward by vacuum through the suction holes and separating a portion of the dicing sheet that protrudes outside an area corresponding to the projection from the semiconductor die; and then moving the projection in parallel with the surface of the stage while suctioning the semiconductor die to be picked by the collet, thereby separating the remaining portion of the dicing sheet from the semiconductor die (see FIG. 9 and FIG. 10 of Japanese Patent No. 3209736).

The method disclosed in Japanese Patent No. 3209736 is to separate the dicing tape from the semiconductor die by producing vacuum in the suction holes to suction the dicing tape into the suction holes. However, once separated from the semiconductor die, the dicing tape covers opening of the suction holes, and consequently it is not possible to suction air around the suction holes after separating portions of the dicing tape immediately above the suction holes. Therefore, while the portions of the dicing sheet immediately above the suction holes can be separated by the suctioning, a portion of the dicing sheet covering around the suction holes cannot be separated by the vacuum suction through the suction holes and remains adhered to the semiconductor die (see FIG. 1 and FIG. 2 of Japanese Patent No. 3209736). In contrast, in the case in which the remaining portion of the dicing sheet is separated by moving the stage, it is possible to reduce the damage caused to the semiconductor die if an area of the remaining portion is smaller, as force exerted to the semiconductor die can be made smaller. However, in order to make the remaining portion after separating the dicing sheet through the suction holes smaller, it is required to provide a suction hole of a size corresponding to a size of the semiconductor die to be picked up. Suctioning the dicing sheet through such a large suction hole may, when adhesive force of the dicing sheet is large, produce a large force that is exerted to the semiconductor die. Semiconductor dies of recent years are particularly made thinner with less intensity, and such a large force may break or deform the semiconductor dies. As described above, with the method disclosed in Japanese Patent No. 3209736, a large force is exerted to the semiconductor die either during the suctioning when a large suction hole is used or during the movement of the stage when small suction holes are used, and therefore the force exerted to the semiconductor die during the separation of the dicing sheet cannot be controlled. This poses a problem that the semiconductor die can be adversely damaged.

Moreover, according to the other method disclosed in Japanese Patent No. 3209736, the portion of the dicing sheet of the semiconductor die that protrudes outside the area corresponding to the projection is separated by producing vacuum in the small suction holes provided only around the projection, and the remaining portion of the dicing sheet of the semiconductor die is separated by the tensile force exerted to the dicing sheet. Accordingly, it is necessary to increase the height of the projection in order to separate the dicing sheet without fail. However, when an adjacent semiconductor die is present in a direction toward which the projection moves, the projection can be brought into contact with the adjacent semiconductor die and damages the semiconductor die. Therefore, the height of the projection is limited, and it is adversely not possible to separate the dicing sheet without fail.

BRIEF SUMMARY OF THE INVENTION

In view of the above problems, an object of the present invention is to facilitate picking up of a semiconductor die with a die pickup apparatus for picking up semiconductor dies.

A die pickup apparatus according to the present invention is a die pickup apparatus for picking up semiconductor dies configured to pick up a semiconductor die attached on a dicing sheet, and the apparatus includes: a stage including a contact surface that is brought into close contact with a first surface of the dicing sheet facing away from a second surface of the dicing sheet, the second surface being attached with the semiconductor dies; a suction opening that is included in the contact surface; a cover plate that is provided for the stage such that a surface of the cover plate freely extends from the contact surface, and that slides along the contact surface so as to open and close the suction opening; and a collet that suctions the semiconductor die, wherein when picking up a semiconductor die, in a state in which the semiconductor die to be picked up is suctioned by the collet, a frontal end of the cover plate facing a side for closing the suction opening is caused to extend from the contact surface and the cover plate is caused to slide while pushing up the dicing sheet and the semiconductor die to form a gap between the suction opening and the frontal end of the cover plate, and subsequently a rear end of the cover plate facing a side for opening the cover plate is caused to extend from the contact surface such that an upper surface of the cover plate is substantially in parallel with the contact surface, the cover plate is caused to slide while pushing up the dicing sheet and the semiconductor die with the upper surface of the cover plate such that the suction opening is sequentially opened, and the dicing sheet is sequentially suctioned into the opened suction opening, thereby sequentially separating the dicing sheet from the semiconductor die to be picked up.

In the die pickup apparatus according to the present invention, it is also preferable that the suction opening linearly extends from an inner circumference side toward an outer circumference side of the stage, and vertical grooves that respectively project from the side ends of the suction opening in a width direction of the suction opening, extend from the contact surface into an interior of the stage, and suction the dicing sheet are provided at corners of the suction opening on a side that is brought into contact with the frontal end of the cover plate.

In the die pickup apparatus according to the present invention, it is also preferable that the stage is provided with a recessed portion that is recessed from the contact surface into the interior of the stage by a thickness of the cover plate and a raised portion that is provided on an outer circumference side of the recessed portion so as to project higher than a bottom surface of the recessed portion, the recessed portion having a surface that is brought into contact with a back surface of the cover plate facing away from a upper surface for pushing up the dicing sheet when the cover plate closes the suction opening, the raised portion being brought into contact with the back surface of the cover plate when the cover plate slides and causing a portion of the upper surface of the cover plate closer to the rear end to extend from the contact surface and supporting the back surface of the cover plate such that the upper surface of the cover plate is substantially in parallel with the contact surface in a state in which the upper surface of the cover plate extends from the contact surface, and a portion of the cover plate that is closer to the frontal end slides in a direction along which the suction opening extends by a slider drive mechanism provided within the stage, and is rotatably attached to a slider that moves toward and away from the contact surface. It is also preferable that a portion of the raised portion closer to the recessed portion configures an inclined surface and an upper surface of the raised portion is a flat surface substantially in parallel with the contact surface.

In the die pickup apparatus according to the present invention, it is also preferable that the cover plate is tabular and includes a curved surface that forms a round corner between a back surface and a surface of the rear end, or that the cover plate is tabular and includes a portion inclined toward the rear end such that the upper surface becomes closer to the back surface of the cover plate as the rear end comes closer.

In the die pickup apparatus according to the present invention, it is also preferable that the suction opening is substantially as wide as the semiconductor die to be picked up, and the cover plate is substantially as wide as the suction opening.

In the die pickup apparatus according to the present invention, it is also preferable that when picking up a semiconductor die, the frontal end of the cover plate that is closed is adjusted to be aligned with a first end of the semiconductor die to be picked up, a position of the cover plate in the width direction is adjusted to be aligned with a position of the semiconductor die in the width direction, the semiconductor die is suctioned by the collet, the cover plate is caused to slide to sequentially open a suction opening from a first end side toward a second end side of the semiconductor die to be picked up, the dicing sheet is sequentially suctioned into the opened suction opening from the first end side toward the second end side of the semiconductor die to be picked up, thereby sequentially separating the dicing sheet from the semiconductor die to be picked up.

In the die pickup apparatus according to the present invention, it is also preferable that the slider drive mechanism is configured to include: a drive unit that is attached to a base body provided on an opposite side of the contact surface of the stage and that drives a first link member provided within the stage in a direction toward and away from the contact surface; a piston provided within the stage and moves toward and away from the contact surface; a stopper provided within the stage and that restricts the motion of the piston in the direction toward and away from the contact surface; a spring that connects the first link member with the piston in the direction toward and away from the contact surface and that is compressed when the piston is brought into contact with the stopper; a guide rail that is attached to the piston and to which the slider is slidably attached, the guide rail extending in a direction substantially in parallel with the contact surface and in which the suction opening extends; and a second link member that is rotatably attached to the piston, connects the slider with the first link member, and converts the motion of the first link member in the direction toward and away from the contact surface into the motion of the slider along the guide rail when the piston is brought into with the stopper.

A method of picking up semiconductor dies according to the present invention is a method of picking up semiconductor dies that are attached on a dicing sheet by means of a die pickup apparatus provided with a stage including a contact surface that is brought into close contact with a first surface of the dicing sheet facing away from a second surface of the dicing sheet to which the semiconductor die to be picked up is attached, the second surface being attached with the semiconductor dies, a suction opening that is included in the contact surface, a cover plate that is provided for the stage such that a frontal end on a side for closing the suction opening and a rear end on a side for opening the cover plate freely extends from the contact surface and that slides along the contact surface so as to open and close the suction opening, and a collet that suctions the semiconductor die, and the method includes: a positioning step of adjusting the frontal end of the cover plate that is closed to be aligned with a first end of the semiconductor die to be picked up, and adjusting a position of the cover plate in the width direction to be aligned with a position of the semiconductor die in the width direction; and a pick up step in which the semiconductor die is picked up by suctioning the semiconductor die to be picked up by the collet, causing the frontal end of the cover plate facing the side for closing the suction opening to extend from contact surface and the cover plate is caused to slide while pushing up the dicing sheet and the semiconductor die to form a gap between the suction opening and the frontal end of the cover plate, and subsequently causing the rear end of the cover plate facing the side for opening the cover plate to extend from the contact surface such that an upper surface of the cover plate is substantially in parallel with the contact surface, sliding the cover plate while pushing up the dicing sheet and the semiconductor die with the upper surface of the cover plate such that the suction opening is sequentially opened, and suctioning the dicing sheet sequentially into the opened suction opening.

In the method of picking up semiconductor dies according to the present invention, it is also preferable that the die pickup apparatus is provided with a stage vertical drive mechanism that moves the stage in a direction toward and away from the dicing sheet, and a wafer holder horizontal drive unit that moves a wafer holder along a plane of the dicing sheet, the wafer holder fixedly holding the dicing sheet to which the semiconductor die to be picked up is attached, and in the positioning step, the contact surface of the stage and the surface of the cover plate for pushing up the dicing sheet are closely brought into contact with the dicing sheet by the stage vertical drive mechanism, and a position of the semiconductor die to be picked up in a horizontal direction is adjusted by the wafer holder horizontal drive unit.

The present invention provides an advantageous effect of facilitating picking up of a semiconductor die with a die pickup apparatus for picking up semiconductor dies.

BRIEF DESCRIPTION OF THE SEVERAL VIEWS OF THE DRAWING

FIG. 8 is an explanatory diagram illustrating a cover plate of the die pickup apparatus for picking up semiconductor dies of an exemplary embodiment according to the present invention;

DETAILED DESCRIPTION OF THE INVENTION

The following describes an exemplary embodiment of the present invention with reference to the accompanying drawing. A wafer and a wafer holder are first described before describing a die pickup apparatus for picking up semiconductor dies according to the present invention.

Figure 1:
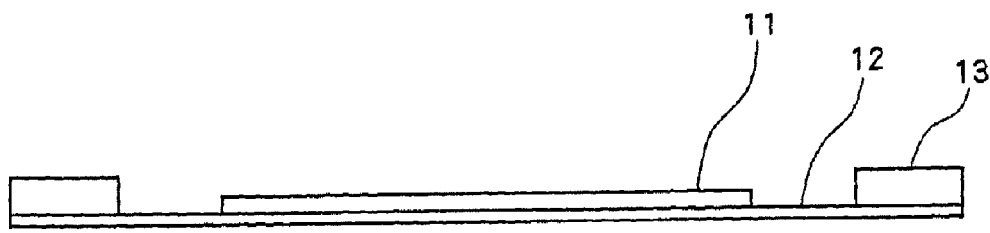
FIG. 1 is an explanatory diagram illustrating a wafer attached to a dicing sheet in an exemplary embodiment of the present invention.
Figure 2:
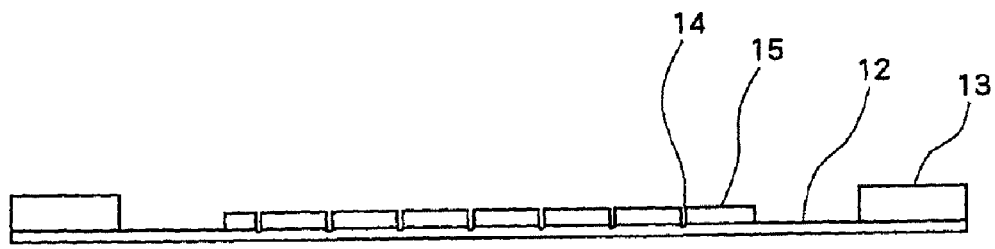
FIG. 2 is an explanatory diagram illustrating semiconductor dies attached to the dicing sheet in an exemplary embodiment of the present invention.

Referring to FIG. 1, a wafer 11 is attached with an adhesive dicing sheet 12 on a back surface thereof, and the dicing sheet 12 is attached to a metal ring 13. The wafer 11 is handled while attached to the metal ring 13 with the dicing sheet 12 interposed therebetween as shown in the drawing. Then, in a dicing step, as shown in FIG. 2, the wafer 11 is diced into semiconductor dies 15 from the other side of the wafer 11 using such as a dicing saw. A cutting gap 14 is thus formed between each pair of the semiconductor dies 15 during the dicing. While the cutting gap 14 reaches a part of the dicing sheet 12 through the semiconductor dies 15, the dicing sheet 12 is not totally cut apart, and the semiconductor dies 15 remain held on the dicing sheet 12.

Figure 3:
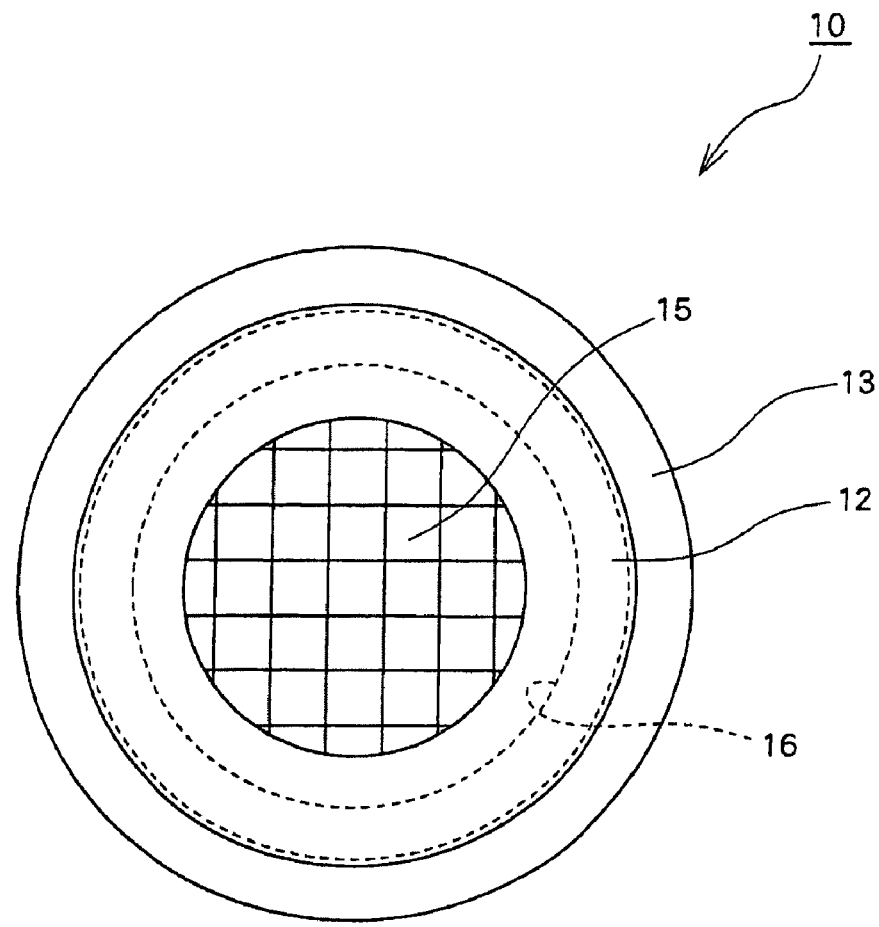
FIG. 3 is an explanatory diagram illustrating a configuration of a wafer holder in an exemplary embodiment of the present invention.
Figure 3:
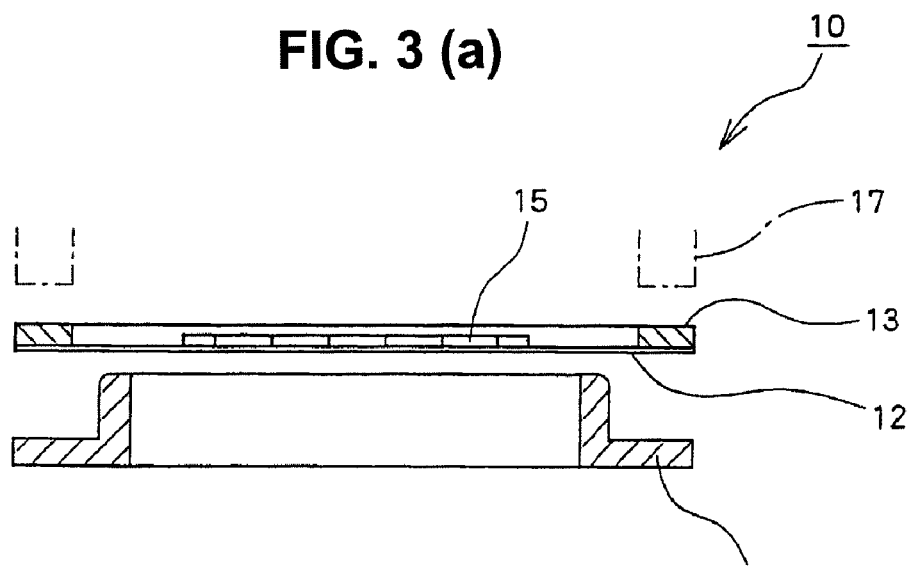

The semiconductor dies 15 attached with the dicing sheet 12 and the ring 13 in this manner are mounted on a wafer holder 10 as shown in FIG. 3. The wafer holder 10 is provided with an annular expand ring 16 having a flange portion and ring retainer 17 that fixedly retains the ring 13 on the flange of the expand ring 16. The ring retainer 17 is driven toward and away from the flange of the expand ring 16 by a ring retainer drive unit that is not shown in the drawing. An inner diameter of the expand ring 16 is greater than a diameter of the wafer on which the semiconductor dies 15 are disposed. The expand ring 16 has a predetermined thickness. The flange is provided along an outer circumference of the expand ring 16 so as to protrudes outwardly from an end surface of the expand ring 16 facing away from the dicing sheet 12. The outer circumference of the expand ring 16 facing toward the dicing sheet 12 is configured to have a curved surface, so that it is possible to smoothly expand the dicing sheet 12 when the dicing sheet 12 is attached to the expand ring 16. Moreover, the wafer holder 10 is configured to move along a surface of the dicing sheet 12 by a wafer holder horizontal drive unit that is not shown.

As shown in FIG. 3(b), the dicing sheet 12 to which the semiconductor dies 15 are attached is substantially flat before being set in the expand ring 16.

Figure 4:
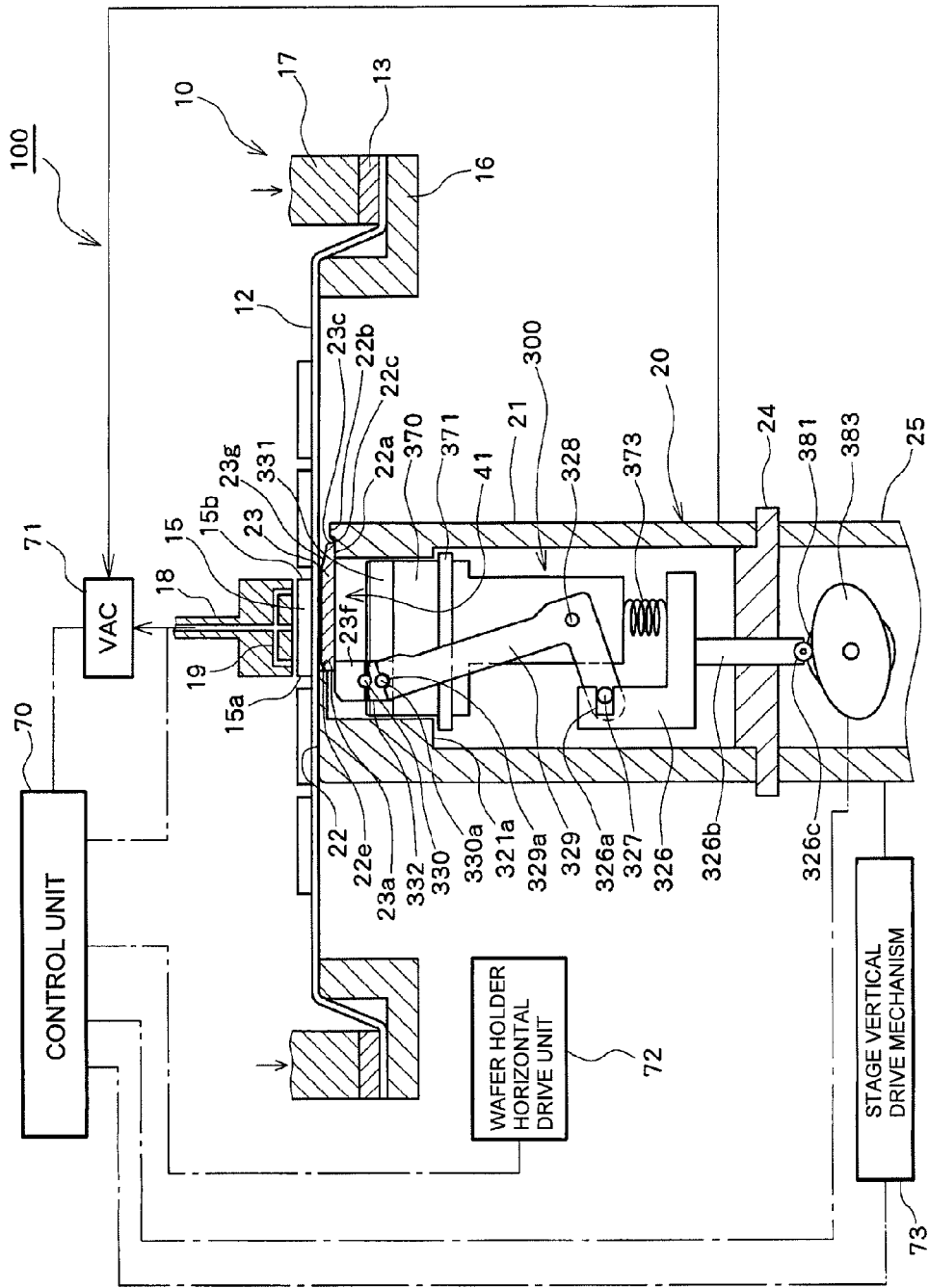
FIG. 4 is an explanatory diagram illustrating a configuration of a die pickup apparatus for picking up semiconductor dies of an exemplary embodiment according to the present invention.

FIG. 4 is a diagram illustrating a configuration of a die pickup apparatus 100 for picking up semiconductor dies, and illustrates a state in which the semiconductor dies 15 attached to the dicing sheet 12 are set to the die pickup apparatus 100 for picking up semiconductor dies. In this state, the ring retainer 17 is lowered toward the ring 13 so as to hold the ring 13 between the retainer and the flange of the expand ring 16. Because there is a difference in level between an upper surface of the expand ring 16 that is brought into contact with the dicing sheet 12 and a surface of the flange, the dicing sheet 12 is expanded along the curved surface at an upper portion of the expand ring 16 by the difference in level between the upper surface of the expand ring and the surface of the flange when the ring 13 is pressed onto the surface of the flange. As a result, a tensile force is exerted to the dicing sheet 12 that is fixed onto the expand ring 16, radially from the center of the dicing sheet 12 toward circumference. In addition, because the dicing sheet 12 is expanded due to the tensile force, the gap between each pair of the semiconductor dies 15 that are attached to the dicing sheet 12 is increased as well.

The wafer holder 10 is attached with a wafer holder horizontal drive unit 72 capable of moving the wafer holder along a plane that corresponds to the dicing sheet. The wafer holder horizontal drive unit 72 can be, for example, of driving the wafer holder 10 horizontally using a motor and a gear that are internally provided, or of moving the wafer holder 10 along a guide in an XY direction by a driving source such as an externally provided motor. In addition, a collet 18 is provided on an upper portion of the wafer holder 10 for moving a semiconductor die 15 while suctioning. The collet 18 is provided with suction holes 19 for suctioning the semiconductor die 15 on a suction surface, and each suction hole 19 is connected to a vacuum apparatus 71. Moreover, a stage 20 is provided under the wafer holder 10, and the stage 20 is driven vertically, that is, in a direction toward and away from the dicing sheet 12, by a stage vertical drive mechanism 73. The stage vertical drive mechanism 73 can be, for example, of driving the stage 20 vertically using a motor and a gear that are internally provided, or of moving the stage 20 along a guide vertically by a driving source such as an externally provided motor.

Figure 5:
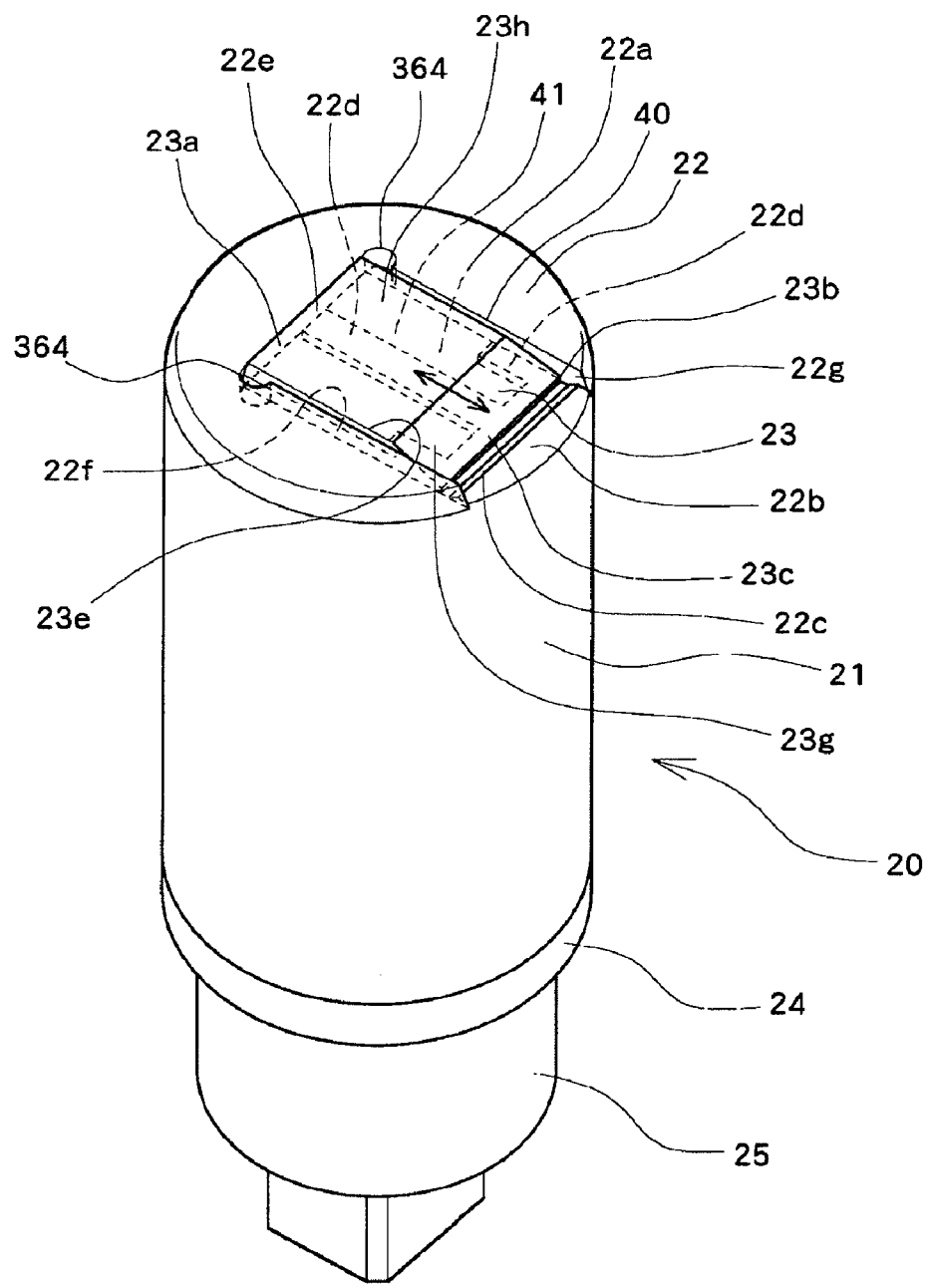
FIG. 5 is a perspective view illustrating a stage of the die pickup apparatus for picking up semiconductor dies of an exemplary embodiment according to the present invention.

Referring to FIG. 5, the stage 20 is provided with a cylindrical housing 21 having an contact surface 22 that is in close contact with the dicing sheet 12 on an upper surface thereof, a base body 24 that is provided on an opposite side of the contact surface 22 of the housing 21, and a drive unit 25 that is provided for the base body 24 and that drives a slider drive mechanism 300 provided inside the housing 21. The base body 24 of the stage 20 is attached to a stage fixing unit that is not shown in the drawing. The contact surface 22 is provided with a recessed portion 22a that is recessed toward an interior of the stage 20 from the contact surface 22, and a raised portion 22b that is provided on an outer circumference side of the recessed portion 22a of the stage 20 and that projects from a bottom surface of the recessed portion 22a. Side surfaces 22f of the recessed portion 22a are respectively the same plane as guiding surfaces 22g that are each provided for either side of the raised portion 22b, and extend linearly from an inner circumference of the stage toward the outer circumference. The raised portion 22b is a bump with a flat upper surface provided between the guiding surfaces 22g, and the height of the raised portion 22b is smaller than the depth of the recessed portion 22a. The bottom surface of the recessed portion 22a continues to the upper surface of the raised portion 22b through an inclined surface 22c that extends from the bottom surface of the recessed portion 22a to the upper surface of the raised portion 22b. A pair of holes 41 communicating with the interior of the stage 20 are provided in the bottom surface of the recessed portion 22a, and ribs 22d are provided at a central portion of the hole 41 and a portion in the hole 41 closer to the circumference of the stage.

The recessed portion 22a is attached with a cover plate 23 whose width is substantially the same as the width between surfaces of the recessed portion 22a and the guiding surface 22g, and that slides along a direction from the recessed portion 22a toward the raised portion 22b. A side of the cover plate 23 that faces toward an end surface 22e of the recessed portion 22a along the sliding direction corresponds to a frontal end 23a, and a side of the cover plate 23 that faces toward the opening corresponds to a rear end 23c. The cover plate 23 is tabular and is provided with a flat portion 23h on which the semiconductor die 15 is placed with the dicing sheet 12 interposed therebetween and an inclined surface 23g that is continuous from the flat portion 23h and inclines downward from the contact surface. A length of the sliding direction of the cover plate 23 is shorter than the sliding direction of the recessed portion 22a, and a thickness of the flat portion 23h of the cover plate 23 is the same as the depth of the recessed portion 22a. Accordingly, when the cover plate 23 is fitted into the recessed portion 22a such that the frontal end 23a of the cover plate 23 is brought into contact with the end surface 22e of the recessed portion 22a, the flat portion 23h which is an upper surface of the cover plate 23 becomes flush with the contact surface 22. A side surface 23b of the cover plate 23 and the side surface 22f of the recessed portion 22a constitute a sliding plane. Both corners of the recessed portion 22a that are brought into contact with the frontal end 23a of the cover plate 23 are each provided with a vertical groove 364 that protrudes outwardly from the side surface 22f of the recessed portion 22a in a width direction of the recessed portion 22a, extends vertically from the contact surface 22 toward an inner surface of the stage 20, and is for suctioning the dicing sheet 12.

Being configured in this manner, the contact surface 22 is provided with a suction opening 40 in a square shape defined by the side surface 22f of the recessed portion 22a, the end surface 22e, and the guiding surface 22g.

Figure 6:
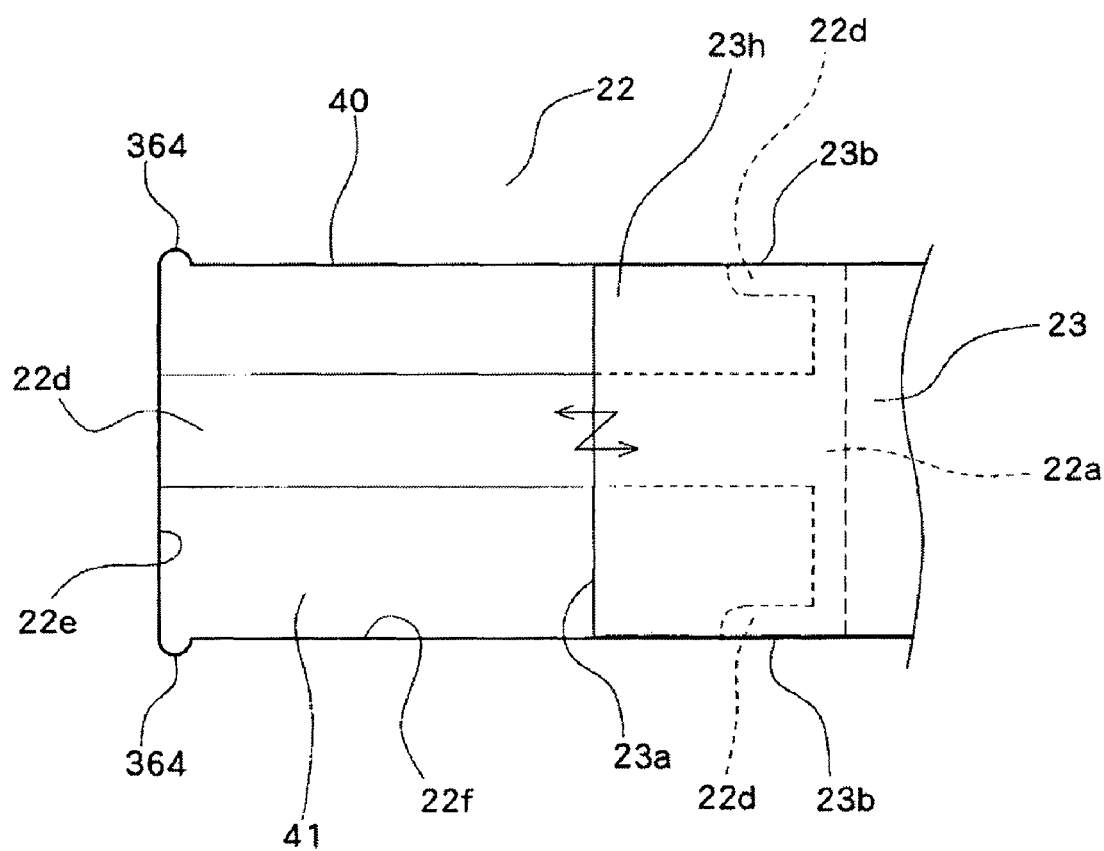
FIG. 6 is a plan view illustrating a state in which a suction opening of the stage of the die pickup apparatus for picking up semiconductor dies of an exemplary embodiment according to the present invention is open.
Figure 7:
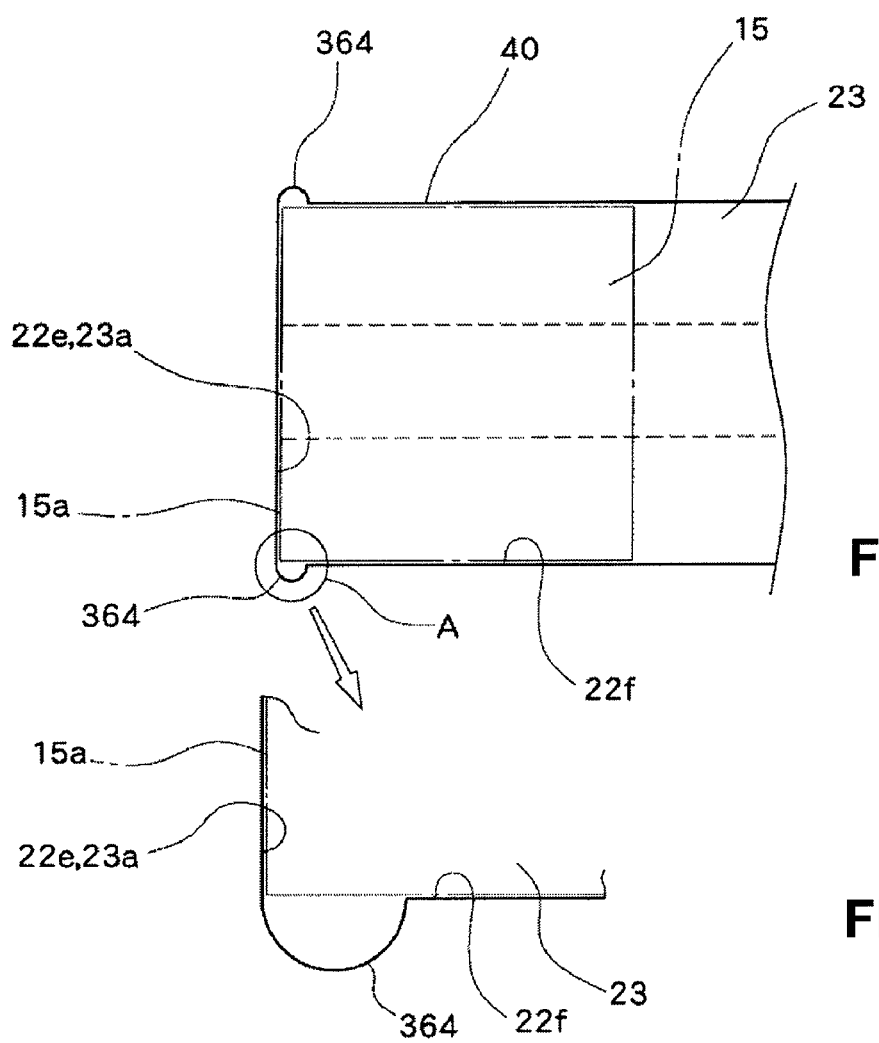
FIG. 7 is a plan view illustrating a state in which the suction opening of the stage of the die pickup apparatus for picking up semiconductor dies of an exemplary embodiment according to the present invention is closed and positional relation of a semiconductor die whose position has been adjusted.

As shown in FIG. 6 and FIG. 7, the suction opening 40 is closed when the frontal end 23a of the cover plate 23 is pressed against the end surface 22e of the recessed portion 22a that faces the inner circumference side of the stage 20, and the suction opening 40 opens when the frontal end 23a of the cover plate 23 moves away from the end surface 22e of the recessed portion 22a as the cover plate 23 slides along the side surface 22f and the guiding surface 22g of the recessed portion 22a from the inner circumference side toward the outer circumference side of the stage 20.

As shown in FIG. 7(a) and FIG. 7(b), as the frontal end 23a of the cover plate 23 is brought into contact with the end surface 22e when the cover plate 23 is closed, when the cover plate 23 is closed, the vertical groove 364 having a cylindrical surface whose cross-sectional shape is a circular sector of about 180 degrees that communicates the contact surface 22 with an interior of the housing 21 is provided for either corner of the cover plate 23 and the recessed portion 22a.

As shown in FIG. 8, a portion closer to the frontal end 23a of the cover plate 23 is tabular, and the flat portion 23h on which the semiconductor die 15 is mounted with the dicing sheet 12 interposed therebetween has substantially even thickness. A curved surface 23*d* is provided for a back surface of the cover plate 23 at a portion close to the rear end 23*c* and forms a round corner between the back surface and the upper surface at the rear end 23*c*, and the inclined surface 23*g* that inclines from the flat portion 23*h* toward the rear end 23*c* such that the upper surface becomes closer to the back surface of the cover plate as the rear end 23*c* comes closer. The inclined surface 23*g* is provided for a region on which the semiconductor die 15 is not placed, and the flat portion 23*h* is longer than the semiconductor die 15. The back surface of the cover plate 23 is flat. The both side surfaces 23*b* of the cover plate 23 are each provided with a chamfer 23*e*. Two arms 23*f* that extend toward the frontal end 23*a* are provided on the back surface of the cover plate 23 closer to the frontal end 23*a*. Each arm 23*f* is provided so as to go through the hole 41 provided for the stage 20 shown in FIG. 5. The arm 23*f* has a U-shaped engagement groove, and is rotatably attached to a slider 332 by engaging the engagement groove with a pin 330 of the slider 332 as shown in FIG. 4.

Figure 9:
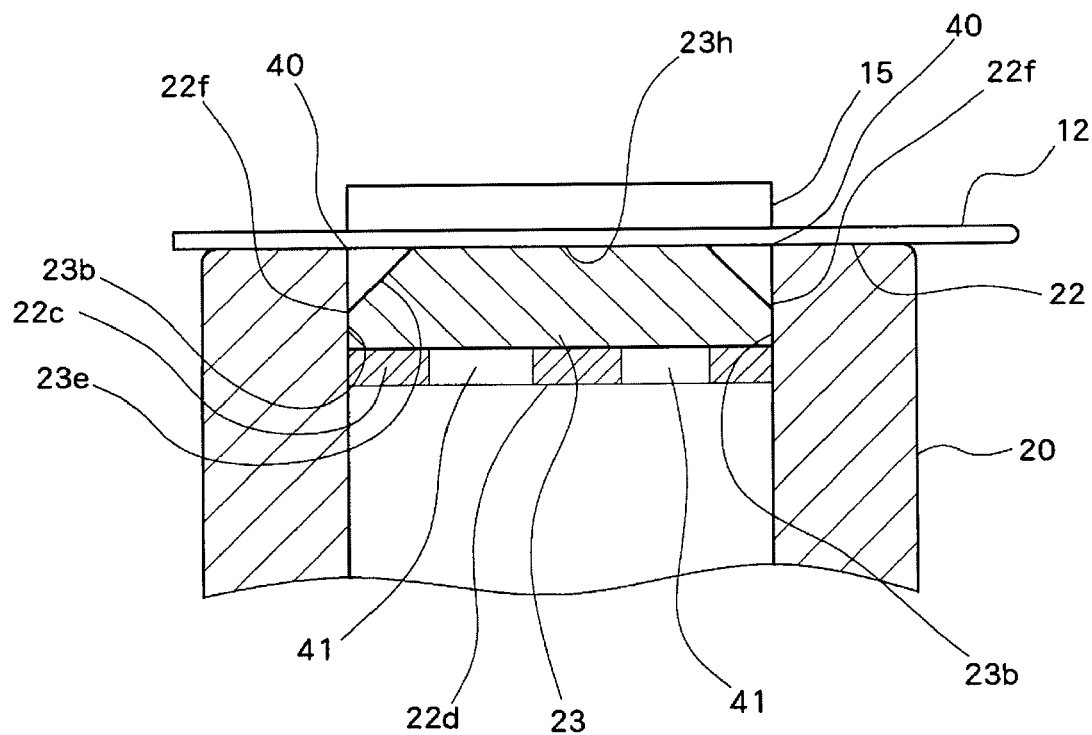
FIG. 9 is a cross-sectional view across the width of the stage of the die pickup apparatus for picking up semiconductor dies of an exemplary embodiment according to the present invention.

As shown in FIG. 9, when the suction opening 40 is closed with the cover plate 23 such that the frontal end 23*a* of the cover plate 23 is brought into contact with the end surface 22*e* of the recessed portion 22*a*, the surface of the flat portion 23*h* of the cover plate 23 becomes flush with the contact surface 22. When the suction opening 40 is closed with the frontal end 23*a* of the cover plate 23 being in contact with the end surface 22*e* of the recessed portion 22*a*, a small V-shaped groove is formed between the contact surface 22 and the cover plate 23. Moreover, a width of the recessed portion 22*a*, that is, a width of the suction opening 40, a width of the cover plate 23, and a width of the semiconductor die 15 are substantially identical, and each side surface 22*f* of the recessed portion 22*a* and each side surface 23*b* of the cover plate 23 are slidably in contact with each other.

As shown in FIG. 4, the die pickup apparatus 100 according to the exemplary embodiment is provided with the slider drive mechanism 300 inside the stage 20, and the slider drive mechanism 300 causes the slider 332 to which the cover plate 23 is rotatably attached to slide. The slider drive mechanism 300 is configured by a first link member 326 that is driven toward and away from the contact surface 22 by the drive unit 25 that is attached to the base body 24 of the stage 20, a piston 370 that is slidably attached to the housing 21 of the stage 20 and that moves toward and away from the contact surface 22, a stopper 321*a* that is provided for the interior of the housing 21 and that engages with a flange 371 of the piston 370 so as to restrict the movement of the piston 370 toward and away from the contact surface 22, a spring 373 that connects the first link member 326 with the piston 370 in a direction toward and away from the contact surface 22, a guide rail 331 that is attached to the piston 370 and that extends in a direction that is substantially in parallel with the contact surface 22 and in which the recessed portion 22*a* extends, the slider 332 that is slidably attached to the guide rail 331, and a second link member 329 that is rotatably attached to the piston 370 by a pin 328, connects the slider 332 with the first link member 326, and, when the piston 370 is brought into contact with the stopper 321*a*, converts a motion of the first link member 326 in the direction toward and away from the contact surface 22 into a motion of the slider 332 along the guide rail 331. The slider 332 is attached with the pin 330 in a cylindrical shape that extends in the direction of the width of the recessed portion 22*a*. The pin 330 is rotatably engaged with a cutout in an inversed U-shape that is provided for the arm 23*f* overhang from the frontal end 23*a* of the cover plate 23 toward the end surface 22*e*. In addition, the housing 21 is configured to be connected to the vacuum apparatus 71 and to allow air in the housing 21 to be evacuated.

The second link member 329 connects the slider 332 with the first link member 326 by a pin 327 provided for a first end being fitted into an engagement groove 326*a* of the first link member 326, and an engagement groove 329*a* provided for a second end clipping a pin 330*a* of the slider 332. A motor 381 for operating the slider drive mechanism 300 is provided within the drive unit 25, and a shaft of the motor 381 is attached with a cam 383 that is in contact with a roller 326*c* at a frontal end of a shaft 326*b* of the first link member 326.

As described above, the slider drive mechanism 300 converts, using the L-shaped second link member 329, the motion of the first link member 326 that moves in the direction toward and away from the contact surface 22 into the motion of the slider 332 in parallel with a plane along the contact surface 22. Accordingly, it is possible to configure the slide mechanism in a compact form to be accommodated within the cylindrical-shaped housing 21.

As shown in FIG. 4, the die pickup apparatus 100 for picking up semiconductor dies is provided with a control unit 70 that is a computer including a CPU and such therein. The drive unit 25, the vacuum apparatus 71, the collet 18, the wafer holder horizontal drive unit 72, and the stage vertical drive mechanism 73 are respectively connected to the die pickup apparatus 100, and the drive unit 25, the vacuum apparatus 71, the collet 18, the wafer holder horizontal drive unit 72, and the stage vertical drive mechanism 73 are configured to be driven according to instructions outputted from the control unit 70. In FIG. 4, single dashed lines represent signal lines connecting the control unit 70 respectively with the drive unit 25, the vacuum apparatus 71, the collet 18, the wafer holder horizontal drive unit 72, and the stage vertical drive mechanism 73.

Now, referring to FIG. 10 through FIG. 14, an operation of picking up the semiconductor die 15 from the dicing sheet 12 using the die pickup apparatus 100 for picking up semiconductor dies is described. The components that have been previously described with reference to FIG. 1 through FIG. 9 are designated by the same reference numerals and not explained herein.

Figure 10:
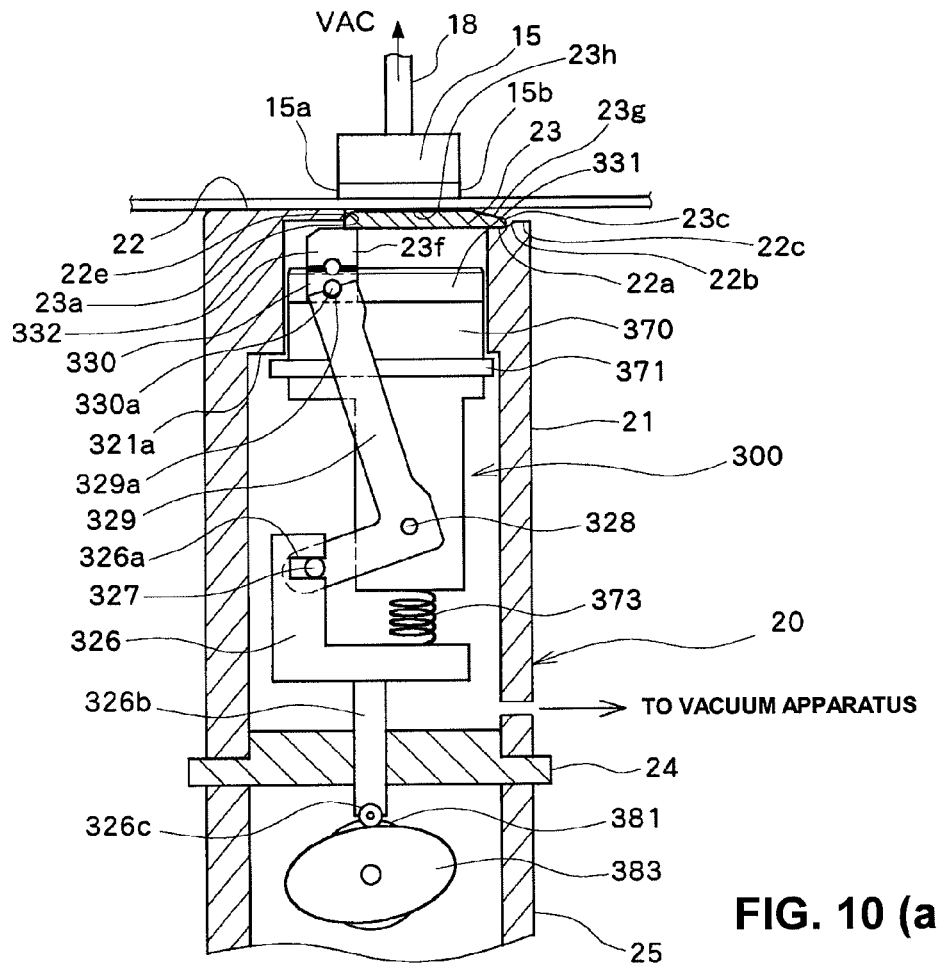
FIG. 10 is an explanatory diagram illustrating a state before a slider drive mechanism of the die pickup apparatus for picking up semiconductor dies of an exemplary embodiment according to the present invention starts its operation.
Figure 10:
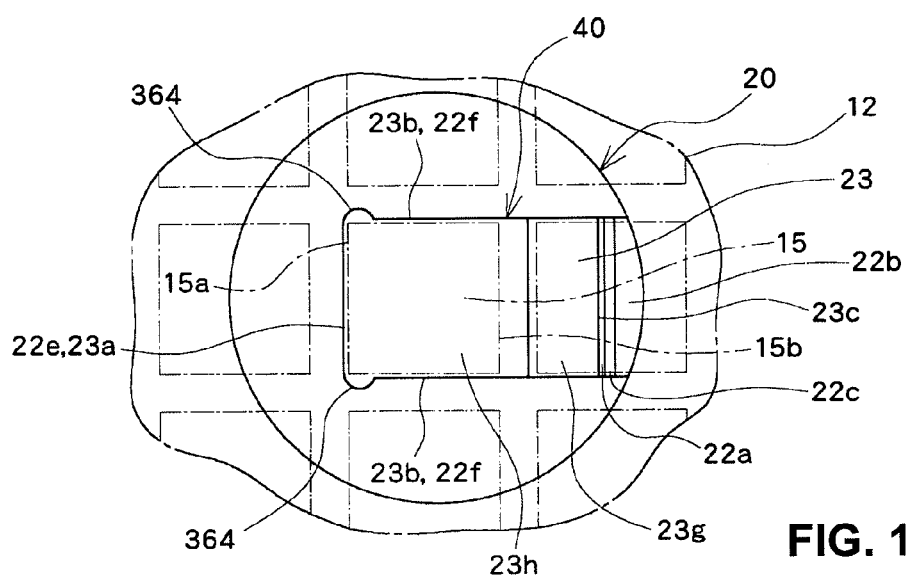

As shown in FIG. 10(*a*), the control unit 70 starts a positioning step of adjusting a position of the cover plate 23 with a position of the semiconductor die 15 in the state in which the cover plate 23 is closed. As the cover plate 23 is at a position at which the suction opening 40 is closed, the frontal end 23*a* of the cover plate 23 comes at a position that is in contact with the end surface 22*e* of the recessed portion 22*a*, and the back surface of the cover plate 23 closer to the rear end 23*c* is on the surface of the recessed portion 22*a* and supported by the recessed portion 22*a*. In addition, the flat portion 23*h* of the upper surface of the cover plate 23 is substantially flush with the contact surface 22. The control unit 70 moves the wafer holder 10 in the parallel direction above a waiting position of the stage 20 by the wafer holder horizontal drive unit 72 shown in FIG. 4. Then, the control unit 70 temporarily stops the parallel movement of the wafer holder 10 when the wafer holder 10 reaches a predetermined position on the waiting position of the stage 20, and moves the stage 20 upward by the stage vertical drive mechanism 73 until the contact surface 22 of the stage 20 and the flat portion 23*h* of the upper surface of the cover plate 23 are brought into close contact with a lower surface of the dicing sheet 12. Once the contact surface 22 of the stage 20 and the flat portion 23*h* of the upper surface of the cover plate 23 are brought into close contact with the lower surface of the dicing sheet 12, the control unit 70 stops the upward movement of the stage 20. Then, the control unit 70 adjusts, using the wafer holder horizontal drive unit 72, the frontal end 23a of the cover plate 23 that is in the closed state to be aligned with a first end 15a of one of the semiconductor dies 15 that is to be picked up, the position of the cover plate 23 in the width direction to be aligned with the position of the semiconductor die 15 in the width direction, and side surfaces of the semiconductor die 15 to be aligned with the side surfaces 23b of the cover plate 23. As the cover plate 23 is substantially as wide as the semiconductor die 15 to be picked up, adjusting one of the side surfaces 23b to be aligned with one of the side surfaces of the semiconductor die 15 realizes the positional adjustment between the both side surfaces of the semiconductor die 15 and the side surfaces 23b of the cover plate 23. At this time, the dicing sheet 12 is applied with a tensile force by the expand ring 16 of the wafer holder 10.

FIG. 10(b) is a plan view illustrating the contact surface 22 of the stage 20 and the upper surface of the cover plate 23, in which the dicing sheet 12 and the semiconductor die 15 mounted thereon are shown by single dashed lines to clarify the positional relation. In FIG. 10(b), in order to distinguish between the semiconductor dies 15 and the cover plate 23 whose widths are substantially the same, the cover plate 23 is shown slightly larger than the semiconductor dies 15. This also applies to FIG. 11(b) and FIG. 13(b). As shown in FIG. 10(b), when the positions of the cover plate 23 and the semiconductor die 15 are adjusted, the semiconductor die 15 is positioned above the flat portion 23h of the cover plate 23.

Upon completion of the approach and the close contact of the stage 20 to the lower surface of the dicing sheet 12 and the positioning of the semiconductor die 15, the control unit 70 finishes the positioning step. Then, the control unit 70 moves the collet 18 immediately above the semiconductor die 15 to be picked up, starts suctioning air through the suction holes 19 using the vacuum apparatus 71, and suctions the semiconductor die 15 by moving the collet 18 down toward the semiconductor die 15 and pressing the collet 18 against the semiconductor die 15.

As shown from FIG. 11 to FIG. 14, the control unit 70 starts a dicing sheet separating step. The control unit 70 evacuates air within the housing 21 of the stage 20 using the vacuum apparatus 71 to produce a vacuum. When a pressure in the interior of the housing 21 is caused to be vacuum, the vertical groove 364 that communicates with the interior of the housing 21 shown in FIG. 11(b) also becomes vacuum, and the dicing sheet 12 is suctioned to the contact surface 22. At this time, while the dicing sheet 12 is pulled downward by vacuum, the dicing sheet 12 has not yet been separated from the semiconductor die 15 in this state. In addition, air flows from the outer circumference of the stage 20 toward the vertical groove 364 through the V-shaped groove between the chamfer 23e provided for the side surface 23b of the cover plate 23 and the side surface 22f of the recessed portion 22a shown in FIG. 9. While a pressure in the V-shaped groove is lower than the atmospheric pressure, the dicing sheet 12 has not been separated by this negative pressure.

Figure 11:
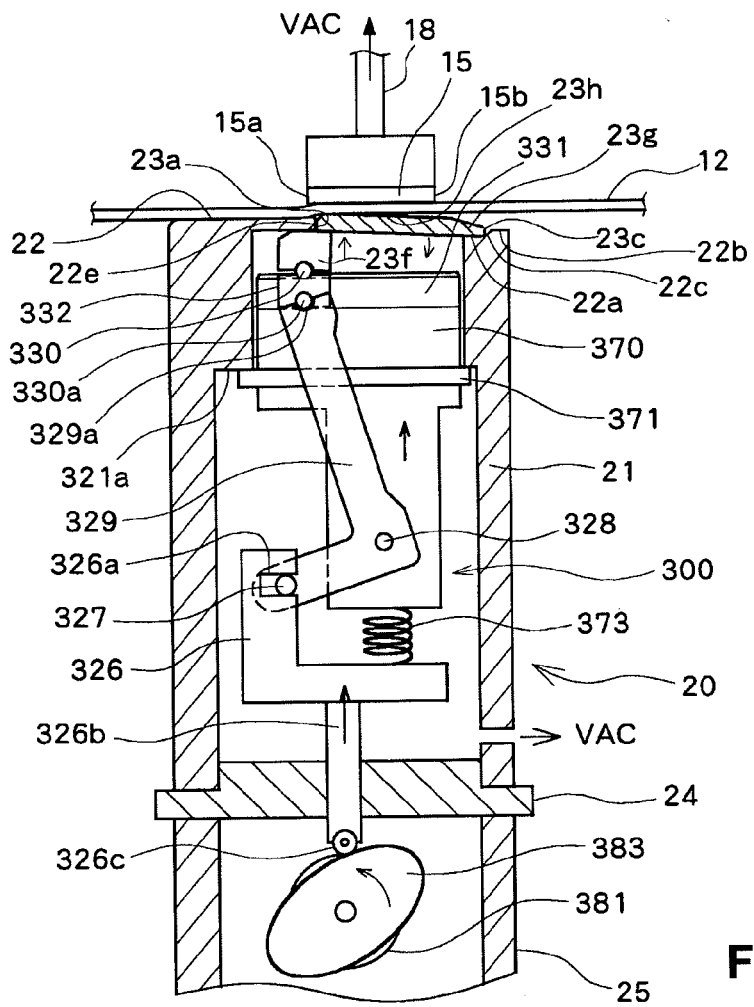
FIG. 11 is an explanatory diagram illustrating a state in which a frontal end of the cover plate of the die pickup apparatus for picking up semiconductor dies of an exemplary embodiment according to the present invention extends from a contact surface.
Figure 11:
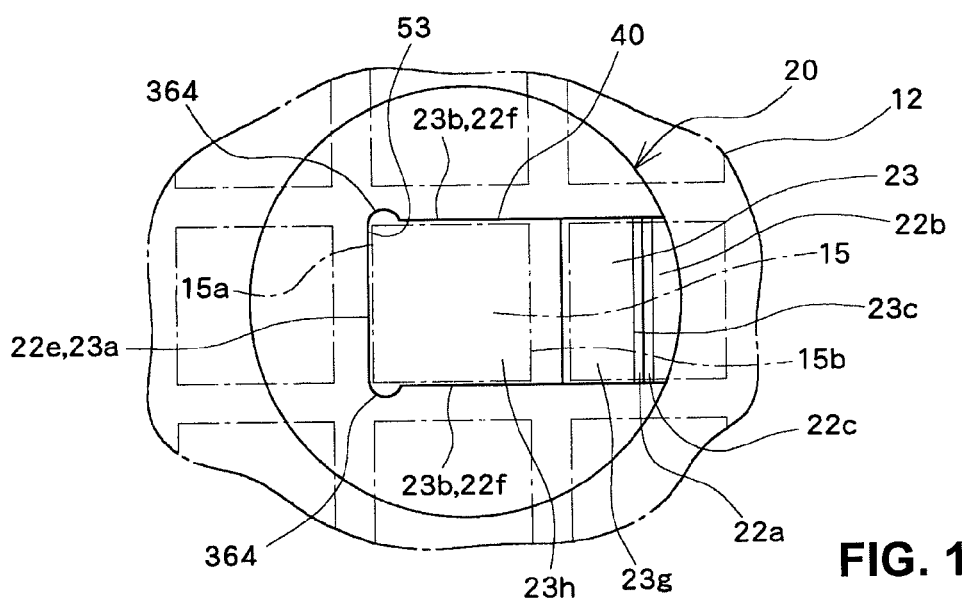

As shown in FIG. 11(a), when the motor 381 of the drive unit 25 of the slider drive mechanism 300 rotates according to an instruction of the control unit 70, the cam 383 attached to the shaft of the motor 381 rotates. The cam 383 is in an elliptical shape whose cam surface is in contact with the roller 326c attached to a tip end of the shaft 326b of the first link member 326, and when the cam 383 rotates in a direction indicated by an arrow shown in FIG. 11, the cam surface of the cam 383 pushes the roller 326c up toward the contact surface 22. The shaft 326b is raised by this motion, and the first link member 326 as a whole is raised toward the contact surface 22. When the first link member 326 as a whole is raised upward, the piston 370 that is connected to a side of the contact surface 22 via the spring 373 is pushed up by the first link member 326, and the piston 370 as a whole is raised toward the contact surface 22. When the piston 370 as a whole is raised toward the contact surface 22, the guide rail 331 that is connected to a side of the contact surface 22 is also raised toward the contact surface 22 along with the piston 370. When the guide rail 331 is raised, the slider 332 that is attached so as to be slidable along an upper surface of the guide rail 331 is also raised toward the contact surface 22. Then, the frontal end 23a of the cover plate 23 that is rotatably engaged with the slider 332 via the arm 23f extends upward from the contact surface 22 along with the upward movement of the slider 332.

As the frontal end 23a of the cover plate 23 extends upward from the contact surface 22, the frontal end 23a of the cover plate 23 pushes up the dicing sheet 12 and the first end 15a of the semiconductor die 15. Then, the frontal end 23a is applied with a downward force by the dicing sheet 12, and therefore the cover plate 23 rotates in a clockwise direction centering the pin 330. The back surface of the cover plate 23 closer to the rear end 23c is supported by the bottom surface of the recessed portion 22a, and the flat portion 23h of the upper surface of the cover plate 23 that pushes up the dicing sheet 12 inclines downwardly from the frontal end 23a toward the rear end 23c of the cover plate 23.

As the frontal end 23a of the cover plate 23 moves upward, the cover plate 23 pushes the semiconductor die 15 to be picked up and the dicing sheet 12 upward. In contrast, the dicing sheet 12 at two corners of the semiconductor die 15 that are adjacent to the vacuumized vertical groove 364 is suction-held with the contact surface 22. Accordingly, the dicing sheet 12 attached to the semiconductor die 15 to be picked up is pulled down obliquely toward the contact surface 22 due to the upward movement of the cover plate 23, and the dicing sheet 12 starts to become separated from the two corners of the semiconductor die 15 that are adjacent to the vertical groove 364 by this oblique downward tensile force. Then, as the frontal end 23a of the cover plate 23 moves upward, the dicing sheet 12 is pulled down obliquely toward the contact surface 22 along the first end 15a of the semiconductor die 15, and the dicing sheet 12 around the first end 15a of the semiconductor die 15 are separated.

Thereafter, when the motor 381 of the slider drive mechanism 300 further rotates according to an instruction of the control unit 70, and when the first link member 326 and the piston 370 are further raised toward the contact surface 22 by the cam 383 that rotates along with the motor 381, an end surface of the flange 371 that extends outwardly from the piston 370 is brought into contact with the stopper 321a provided for the housing 21. As a result, the piston 370 is prevented from further moving toward the contact surface 22 due to the stopper 321a, and the frontal end 23a of the cover plate 23 stops extending from the contact surface 22 at a predetermined position. When the frontal end 23a is raised up to the predetermined position, a separation line 53 of the dicing sheet 12 is formed along the curved surface of the frontal end 23a.

Figure 12:
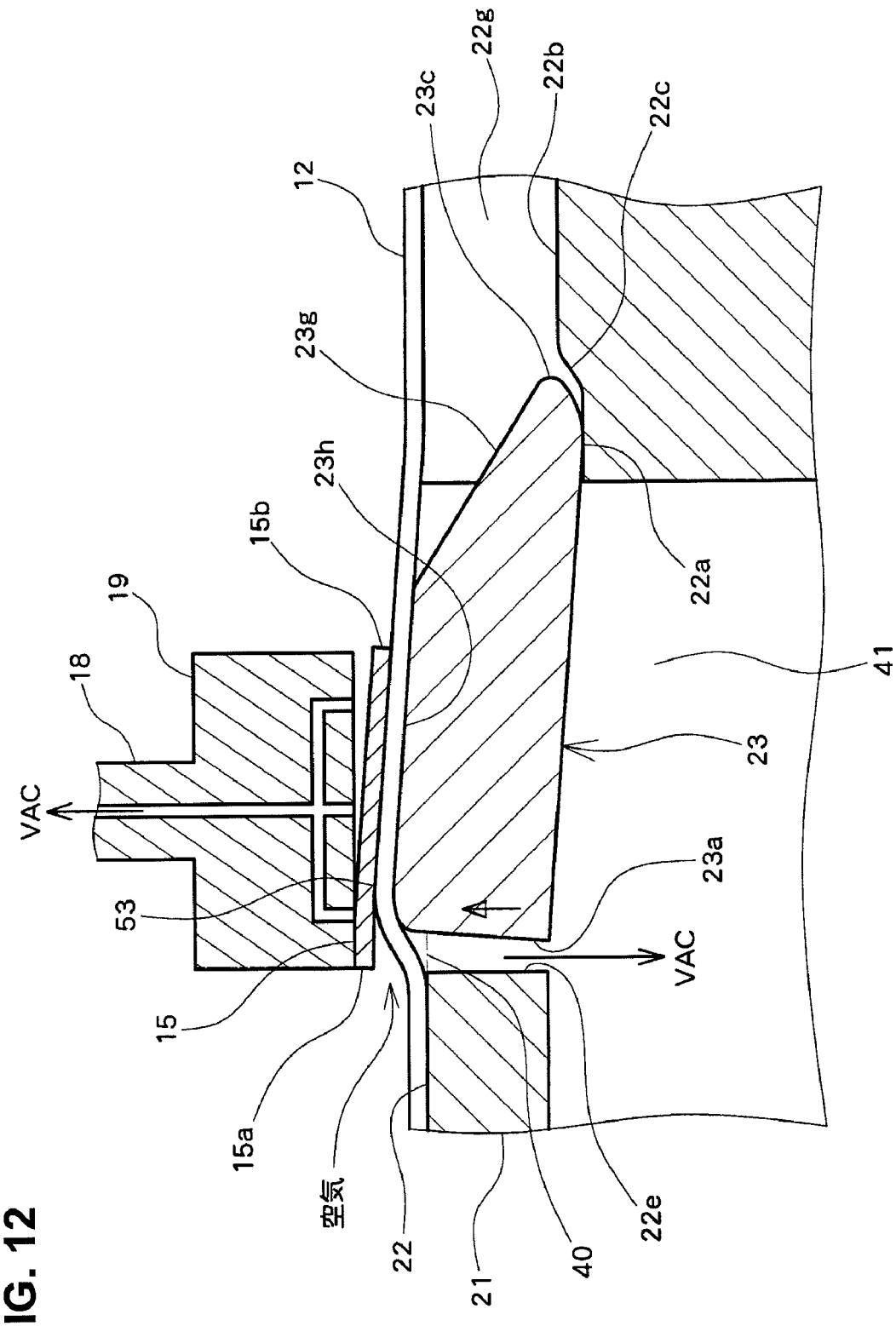
FIG. 12 is an explanatory diagram illustrating the cover plate, the semiconductor die, the dicing sheet, and a collet in the state in which the frontal end of the cover plate of the die pickup apparatus for picking up semiconductor dies of an exemplary embodiment according to the present invention extends from the contact surface.

As shown in FIG. 12, the cover plate 23 rotates as the frontal end 23a of the cover plate 23 moves upward, the frontal end 23a of the cover plate 23 slightly moves further to the direction toward which the cover plate 23 slides than the first end 15a of the semiconductor die 15. As a result, the separation line 53 is formed slightly further to the direction toward which the cover plate 23 slides than the first end 15a of the semiconductor die 15.

The tensile force toward the contact surface 22 by the dicing sheet 12 is not attached to the portion of the semiconductor die 15 from which the dicing sheet 12 has been separated. In addition, air comes into a portion between the semiconductor die 15 and the dicing sheet 12 from the first end 15a to the separation line 53 from which the dicing sheet 12 has been separated, and a pressure of this portion of the semiconductor die 15 facing toward the dicing sheet 12 becomes the atmospheric pressure. The portion of the semiconductor die 15 from which the dicing sheet 12 has been separated is suctioned by vacuum to the collet 18 that is raised along with the cover plate 23.

In contrast, while the collet 18 that is suctioning the semiconductor die 15 is raised as the cover plate 23 moves upward, the suction surface of the collet 18 does not incline as the flat portion 23h of the upper surface of the cover plate 23 inclines due to the rotation of the cover plate 23. Also, at a portion of the semiconductor die 15 that is on the side of the rear end 23c of the cover plate 23 centering the separation line 53 and from which the dicing sheet 12 has not been yet separated, the adhesive force between the semiconductor die 15 and the dicing sheet 12 is greater than the vacuum suctioning force of the collet 18. As a result, a portion of the semiconductor die 15 closer to a second end 15b is separated from the collet 18 and inclines along the flat portion 23h on the upper surface of the cover plate 23 along with the dicing sheet 12. At this time, a slight bending deformation is produced in the semiconductor die 15 between the portion that is moved upward while being suctioned by the collet 18 and the portion that is separated from the collet 18.

As shown in FIG. 12, as a thickness of the cover plate 23 is greater than a predetermined height of the extension of the contact surface 22 of the frontal end 23a, the side surfaces 23b of the cover plate 23 are respectively in contact with the side surfaces 22f of the recessed portion 22a. Moreover, the back surface of the rear end 23c of the cover plate 23 is in contact with the bottom surface of the recessed portion 22a. In addition, the dicing sheet 12 that has been separated from the semiconductor die 15 covers the vertical groove 364. As a result, air hardly flows into the interior of the housing 21 from outside of the housing 21, and thus the interior of the housing 21 maintained in a vacuum state.

The spring 373 of the slider drive mechanism 300 shown in FIG. 11(a) has intensity sufficient for not being compressed by pushing the frontal end 23a of the cover plate 23 from the contact surface 22. Accordingly, a distance between the piston 370 and the first link member 326 hardly changes even when the frontal end 23a of the cover plate 23 is pushed up to the predetermined height extending from the contact surface 22. As a result, the upward movement of the first link member 326 does not cause the cover plate 23 to slide, and the cover plate 23 only extends from the contact surface 22.

As shown in FIG. 13(a), when the cam 383 of the slider drive mechanism 300 further rotates according to an instruction of the control unit 70 and the first link member 326 is pushed up toward the contact surface 22, the spring 373 between the piston 370 and the first link member 326 that is not able to move toward the contact surface 22 starts to become compressed by the motor 381 and the cam 383 in the direction toward and away from the contact surface 22. When the spring 373 is compressed, the piston 370 does not move toward the contact surface 22, and only the first link member 326 moves toward the contact surface 22. Accordingly, the pin 328 of the piston 370 is not raised toward the contact surface 22, and only the pin 327 of the second link member 329 within the engagement groove 326a of the first link member 326 is raised toward the contact surface 22. Then, the second link member 329 starts to rotate centering the pin 328. By this rotational motion, the engagement groove 329a at the second end of the second link member 329 moves toward the outer circumference of the stage 20, and the slider 332 to which the pin 330a within the engagement groove 329a is fixed and the cover plate 23 that is rotatably engaged with the pin 330 of the slider 332 of via the arm 23f start to slide toward the outer circumference of the stage 20.

Figure 14:
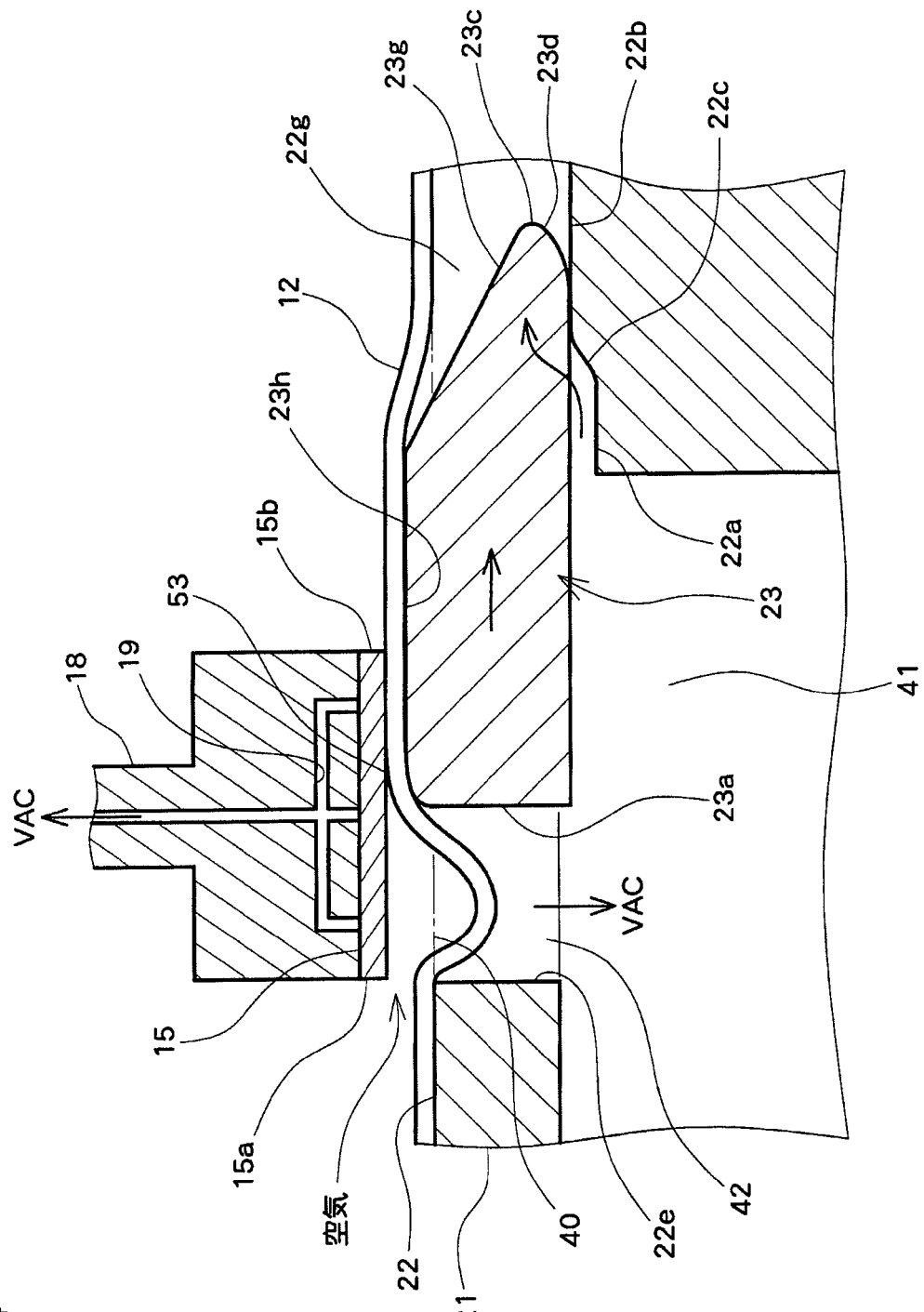
FIG. 14 is an explanatory diagram illustrating the cover plate, the semiconductor die, the dicing sheet, and the collet in the state in which the rear end side of the cover plate of the die pickup apparatus for picking up semiconductor dies of an exemplary embodiment according to the present invention extends from the contact surface and the cover plate slides.

As shown in FIG. 14, when the cover plate 23 starts to slide toward the outer circumference of the stage 20, the curved surface 23d provided for the back surface of the cover plate 23 at the rear end 23c is brought into contact with the inclined surface 22c that connects the raised portion 22b and the bottom surface of the recessed portion 22a. When the cover plate 23 further slides, the curved surface 23d of the cover plate 23 moves upward along the inclined surface 22c. With this, the upper surface of the flat portion 23h of the cover plate 23 closer to the rear end 23c starts to extend from the contact surface 22. Then, when the cover plate 23 further slides, the curved surface 23d of the cover plate 23 moves over the inclined surface 22c and the back surface of the cover plate 23 is brought into contact with the upper surface of the raised portion 22b. The raised portion 22b projecting from the bottom surface of the recessed portion 22a is substantially as high as the upper surface of the cover plate 23 extending from the contact surface 22, and accordingly, when the back surface of the cover plate 23 is brought into contact with the upper surface of the raised portion 22b, the flat portion 23h of the upper surface of the cover plate 23 is substantially in parallel with the contact surface 22. As the back surface of the cover plate 23 is flat, the flat portion 23h on the upper surface of the cover plate 23 slides substantially in parallel with the contact surface 22 when the cover plate 23 further slides.

When the flat portion 23h of the upper surface of the cover plate 23 is substantially in parallel with the contact surface 22, the upper surface of the flat portion 23h is also substantially in parallel with the suction surface of the collet 18. Therefore, the portion of the semiconductor die 15 that has been separated from the collet 18 when the flat portion 23h of the cover plate 23 is inclined is again suctioned by the collet 18. When the flat portion 23h as a whole on which the semiconductor die 15 is disposed extends from the contact surface 22 such that the cover plate 23 is substantially in parallel with the contact surface 22, the tensile force pulling the dicing sheet 12 around the cover plate 23 downward increases, and therefore it is possible to facilitated the separation of the dicing sheet 12.

Figure 15:
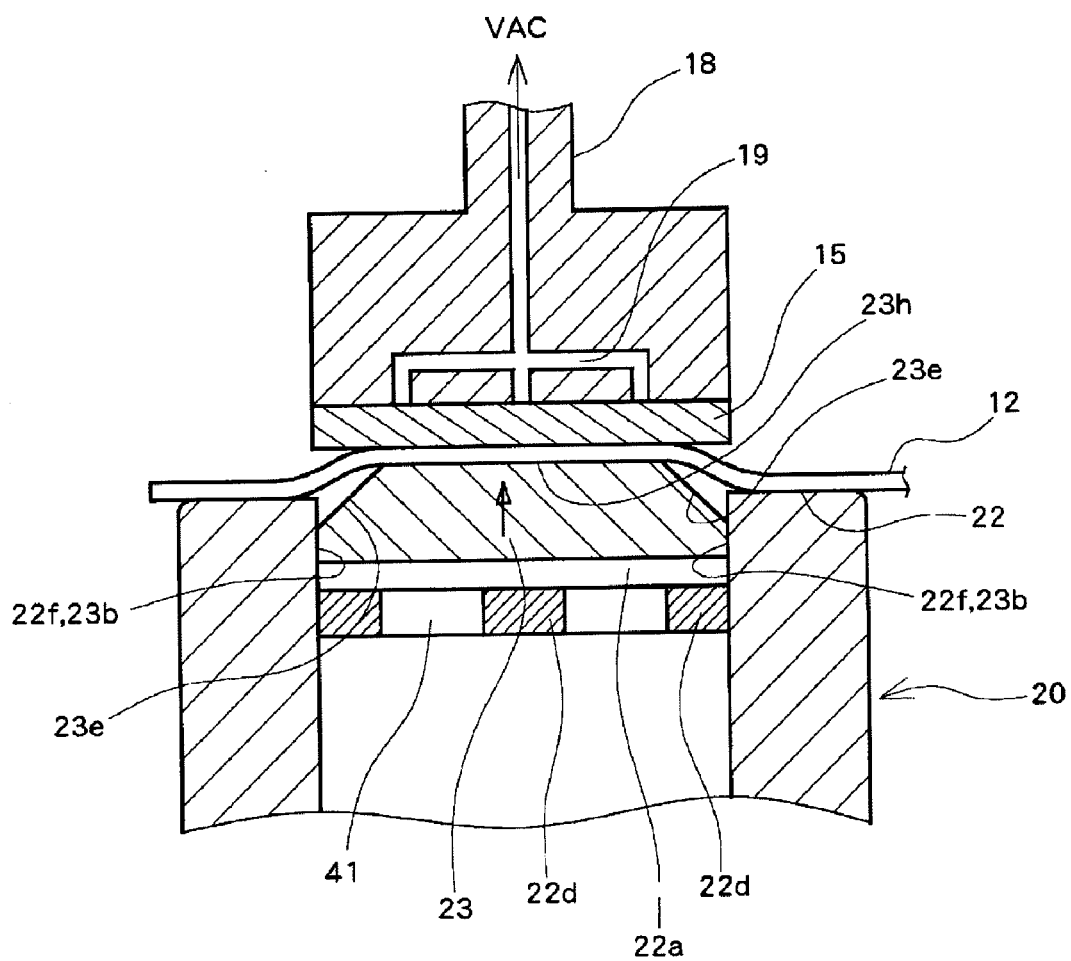
FIG. 15 is a cross-sectional view across the width of the stage illustrating the cover plate, the semiconductor die, the dicing sheet, and the collet in the state shown in FIG. 14.

As shown in FIG. 15, when the flat portion 23h of the cover plate 23 extends from the contact surface 22, the chamfer 23e provided for the side surface 23b of the cover plate 23 also extends from the contact surface 22, the tensile force pulling the dicing sheet 12 downward also increases at the side surfaces of the semiconductor die 15. As a result, in addition to the portion of the first end 15a of the semiconductor die 15, the dicing sheet 12 at portions of the side surfaces is also separated. As the back surface of the cover plate 23 is supported by the upper surface of the raised portion 22b shown in FIG. 14, the back surface of the cover plate 23 is not in contact with the bottom surface of the recessed portion 22a.

As shown in FIG. 13(b), when the cover plate 23 slides, the frontal end 23a of the cover plate 23 moves away from the end surface 22e of the recessed portion 22a, and the suction opening 40 opens, thereby creating an opened portion 42 whose width is substantially the same as that of the semiconductor die 15 to be picked up. Because the interior of the housing 21 of the stage 20 is brought into a vacuum state by the vacuum apparatus 71, the opened portion 42 suctions the dicing sheet 12 therein. Then, the dicing sheet 12 is suctioned into the opened portion 42 along with the sliding of the cover plate 23, and separated from the semiconductor die 15.

As shown in FIG. 14, when the cover plate 23 slides and the separation line 53 moves from the first end 15*a* toward the second end 15*b* of the semiconductor die 15, air comes into a portion between the semiconductor die 15 and the dicing sheet 12 from the first end 15*a* to the separation line 53 from which the dicing sheet 12 has been separated, and a pressure of this portion of the semiconductor die 15 facing toward the dicing sheet 12 becomes the atmospheric pressure. As the cover plate 23 slides, the opened portion 42 increases its size toward the outer circumference of the stage 20, and the separation line 53 also moves parallelly toward the outer circumference of the stage 20 sequentially. The dicing sheet 12 is sequentially separated from the first end 15*a* toward the second end 15*b* of the semiconductor die 15 along the separation line 53, and sequentially suctioned into the opened portion 42. At this time, as the dicing sheet 12 is first separated from the portion of the side surfaces the semiconductor die 15, the dicing sheet 12 is more smoothly separated from the first end 15*a* toward the second end 15*b* of the semiconductor die 15 by the movement of the separation line 53.

Figure 13:
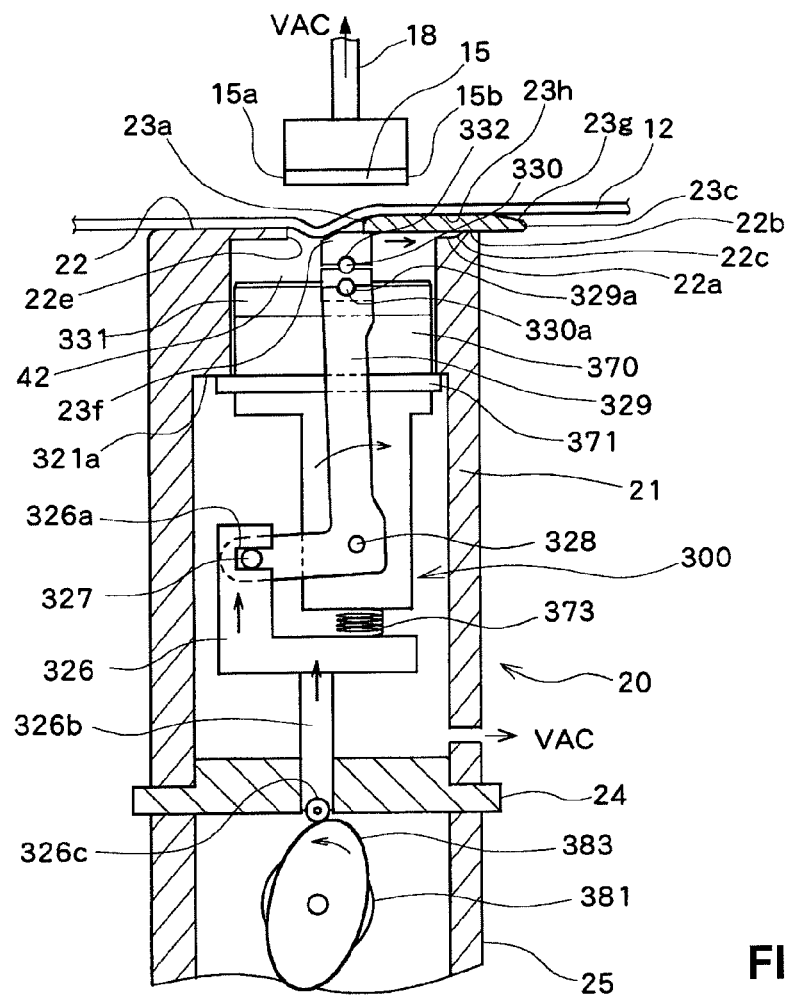
FIG. 13 is an explanatory diagram illustrating a state in which a rear end side of the cover plate of the die pickup apparatus for picking up semiconductor dies of an exemplary embodiment according to the present invention extends from the contact surface and the cover plate slides.
Figure 13:
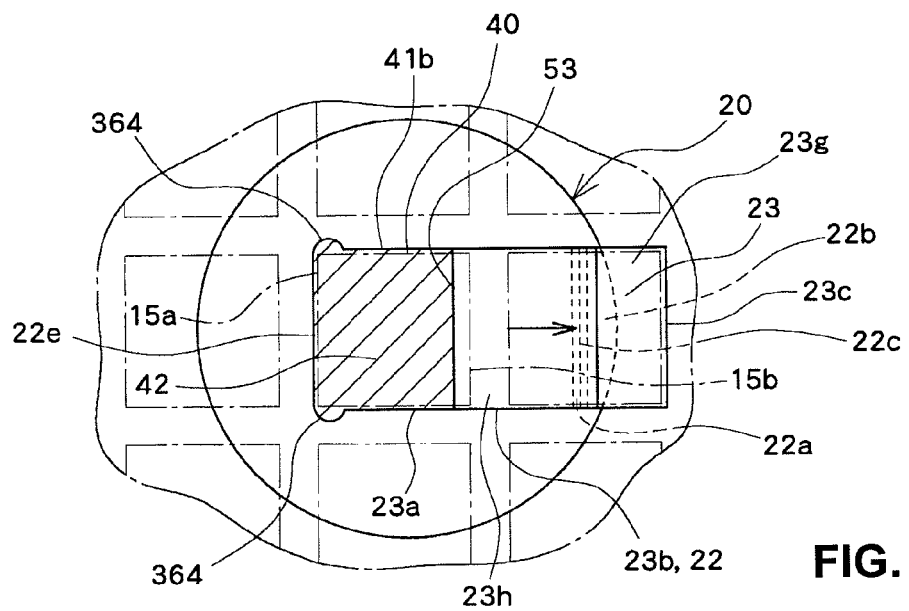

As shown in FIG. 13(*a*), as the cover plate 23 slides, the rear end 23*c* of the cover plate 23 extends from the outer circumference of the stage 20. Then, the back surface of the cover plate 23 facing away from the upper surface that pushes up the dicing sheet 12 slides in contact with the upper surface of the raised portion 22*b*. As a result, it is possible to prevent air from coming into the housing 21 through the back surface of the cover plate 23, and the vacuum state within the housing 21 can be favorably maintained during the sliding of the cover plate 23, and the dicing sheet 12 can be effectively suctioned into the suction opening 40 by vacuum. As the inclined surface 23*g* is provided for the upper surface of the cover plate 23 closer to the rear end 23*c*, the inclined surface 23*g* at the rear end 23*c* of the cover plate 23 goes under the lower surface of the adjacent semiconductor die 15 when sliding the cover plate 23, thereby preventing the semiconductor dies 15 that are adjacent from being damaged by sliding of the cover plate 23. Therefore, it is possible to facilitate the picking up of the semiconductor die 15 even when there are the adjacent semiconductor dies 15.

Then, the opened portion 42 is covered by the separated the dicing sheet 12. However, as the dicing sheet 12 is suctioned into the opened portion 42, and the frontal end 23*a* of the cover plate 23 slides toward a portion from which the dicing sheet 12 has not been separated, the suctioning of the dicing sheet 12 by the opened portion 42 is not interrupted. In this manner, the dicing sheet 12 as a whole can be sequentially separated from the first end 15*a* toward the second end 15*b* of the semiconductor die 15 by suctioning into the opened portion 42, without leaving an unseparated portion.

When the entire dicing sheet 12 that has been attached to the semiconductor die 15 is separated, the semiconductor die 15 is picked up by the collet 18.

After picking up the semiconductor die 15, when the cam 383 of the slider drive mechanism 300 further rotates according to an instruction of the control unit 70, the shaft 326*b* of the first link member 326 now moves downward by the rotation of the cam 383, and, along with this downward movement, the cover plate 23 slides toward a direction in which the frontal end 23*a* faces toward the end surface 22*e* of the recessed portion 22*a*. When the frontal end 23*a* is brought into contact with the end surface 22*e*, the cover plate 23 closes the suction opening 40. Then, the compressing force exerted to the spring 373 is released. Then, as the cam 383 further rotates and the shaft 326*b* moves down, the piston 370, the first link member 326, and the second link member 329 together move downward, and the frontal end 23*a* of the cover plate 23 moves down to the position substantially the same as the upper surface of the contact surface 22 and returns to the original position.

As described above, according to the exemplary embodiment, the cover plate 23 is caused to slide in the state in which the flat portion 23*h* as a whole of the cover plate 23 on which the semiconductor die 15 is placed extends upward from the contact surface 22, and the dicing sheet 12 is sequentially suctioned into the opened portion 42 of the suction opening 40 that appears immediately below the semiconductor die 15 and whose width is substantially the same as that of the semiconductor die 15, thereby separating the dicing sheet 12. Therefore, the dicing sheet 12 is separated by the downward force produced due to the vacuum suctioning and by the downward force applied to the dicing sheet 12 due to the cover plate 23 extending from the contact surface 22, and thus it is advantageously possible to facilitate the picking up of the semiconductor die 15. According to the exemplary embodiment, the cover plate 23 is caused to slide after pushing up the semiconductor die 15 by causing the frontal end 23*a* of the cover plate 23 to extend from the contact surface 22 in the state in which the vertical groove 364 is brought into the vacuum state, and making a trigger for separating the dicing sheet 12 at the both corners of the first end 15*a* of the semiconductor die 15 to be picked up by the downward tensile force produced at the dicing sheet 12, and then the dicing sheet 12 is suctioned into the opened portion 42. Thus, it is advantageously possible to further facilitate the separation of the dicing sheet 12. As the chamfer 23*e* is provided for the side surface 23*b* of the cover plate 23, the dicing sheet 12 at the portion of the side surfaces of the semiconductor die 15 can be separated when the flat portion 23*h* as a whole of the cover plate 23 extends from the contact surface 22, thereby making a trigger for separating the dicing sheet 12 at the side surfaces of the semiconductor die 15. Thus, it is advantageously possible to further facilitate the separation of the dicing sheet 12.

According to the exemplary embodiment, the cover plate 23 is caused to slide from the side of the first end 15*a* toward the side of the second end 15*b* of the semiconductor die 15 to have the opened portion 42 sequentially suction the dicing sheet 12 to separate the dicing sheet 12. Accordingly, even if the opened portion 42 is covered by the dicing sheet 12 suctioned into the opened portion 42, the cover plate 23 slides toward the portion from which the dicing sheet 12 has not been separated, and the dicing sheet 12 as a whole can be sequentially separated by being suctioned into the opened portion 42. Thus, it is advantageously possible to facilitate the separation of the entire dicing sheet 12.

According to the exemplary embodiment, the downward inclined surface 23*g* is provided for the upper surface of the cover plate 23, the rear end 23*c* of the cover plate 23 can goes under the lower surface of the adjacent semiconductor die 15 when sliding the cover plate 23, thereby preventing the adjacent semiconductor dies 15 from being damaged by sliding of the cover plate 23. Thus, it is advantageously possible to facilitate the picking up of the semiconductor die 15 even when there are the adjacent semiconductor dies 15.

According to the exemplary embodiment, the stage 20 only moves upward and downward in the direction toward and away from the dicing sheet 12 by the stage vertical drive mechanism 73, and a movement mechanism for moving in the horizontal direction along the dicing sheet 12 is not provided. Consequently, no backlash and such is caused by the mechanism with respect to the horizontal direction, and it is possible to realize favorable stability in the direction along the dicing sheet 12. Also, because the positional adjustment between the semiconductor die 15 to be picked up and the cover plate 23 in the direction along the plane of the dicing sheet 12 is carried out by the wafer holder horizontal drive unit 72, the position of the stage 20 in the horizontal direction during the horizontal positional adjustment becomes stable. Thus, it is advantageously possible to reduce an occurrence of misalignment during the positioning between the cover plate 23 of the stage 20 and the semiconductor dies 15 attached to the dicing sheet 12.

In the exemplary embodiment as described above, the raised portion 22b is described as a bump provided between the guiding surfaces 22g and having the flat surface. However, the raised portion 22b does not necessarily have to be a bump as long as the inclined surface 22c is provided next to the recessed portion 22a and can be configured by a number of independent projections.

The foregoing description of the exemplary embodiment of the present invention has been provided for the purpose of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention from various embodiments and with the various modifications as are suited to the particular use contemplated. It is intended that the scope of the invention be defined by the following claims and their equivalents.

What is claimed is:

1. A die pickup apparatus for picking up semiconductor dies configured to pick up a semiconductor die attached on a dicing sheet, the apparatus comprising:
   a stage comprising a contact surface that is brought into close contact with a first surface of the dicing sheet facing away from a second surface of the dicing sheet, the second surface being attached with the semiconductor dies and the stage having a suction opening that is provided on the contact surface;
   a cover plate that is provided for the stage such that a surface of the cover plate freely extends upward from the contact surface, and that slides along the contact surface so as to open and close the suction opening; and
   a collet that suctions the semiconductor die,
   wherein when picking up a semiconductor die, in a state in which the semiconductor die to be picked up is suctioned by the collet, a frontal end of the cover plate facing a side for closing the suction opening is caused to extend upward from the contact surface and the cover plate is caused to slide while pushing up the dicing sheet and the semiconductor die to form a gap between the suction opening and the frontal end of the cover plate, and subsequently a rear end of the cover plate facing a side for opening the cover plate is caused to extend upward from the contact surface such that an upper surface of the cover plate is substantially in parallel with the contact surface, the cover plate is caused to slide while pushing up the dicing sheet and the semiconductor die with the upper surface of the cover plate such that the suction opening is sequentially opened, and the dicing sheet is sequentially suctioned into the opened suction opening, thereby sequentially separating the dicing sheet from the semiconductor die to be picked up.

2. The die pickup apparatus according to claim 1, wherein the suction opening linearly extends from an inner circumference side toward an outer circumference side of the stage, and
   vertical grooves that respectively project from the side ends of the suction opening in a width direction of the suction opening, extend from the contact surface into an interior of the stage, and suction the dicing sheet are provided at corners of the suction opening on a side that is brought into contact with the frontal end of the cover plate.

3. The die pickup apparatus according to claim 1, wherein the stage is provided with a recessed portion that is recessed from the contact surface into the interior of the stage by a thickness of the cover plate and a raised portion that is provided on an outer circumference side of the recessed portion so as to project higher than a bottom surface of the recessed portion, the recessed portion having a surface that is brought into contact with a back surface of the cover plate facing away from an upper surface for pushing up the dicing sheet when the cover plate closes the suction opening, the raised portion being brought into contact with the back surface of the cover plate when the cover plate slides and causing a portion of the upper surface of the cover plate closer to the rear end to extend from the contact surface and supporting the back surface of the cover plate such that the upper surface of the cover plate is substantially in parallel with the contact surface in a state in which the upper surface of the cover plate extends from the contact surface, and
   a portion of the cover plate that is closer to the frontal end slides in a direction along which the suction opening extends by a slider drive mechanism provided within the stage, and is rotatably attached to a slider that moves toward and away from the contact surface.

4. The die pickup apparatus according to claim 3, wherein a portion of the raised portion closer to the recessed portion configures an inclined surface and an upper surface of the raised portion is a flat surface substantially in parallel with the contact surface.

5. The die pickup apparatus according to claim 3, wherein the cover plate is tabular and includes a curved surface that forms a round corner between a back surface and a surface of the rear end.

6. The die pickup apparatus according to claim 3, wherein the cover plate is tabular and includes a portion inclined toward the rear end such that the upper surface becomes closer to the back surface of the cover plate as the rear end comes closer.

7. The die pickup apparatus according to claim 1, wherein the suction opening is substantially as wide as the semiconductor die to be picked up, and
   the cover plate is substantially as wide as the suction opening.

8. The die pickup apparatus according to claim 1, wherein when picking up a semiconductor die, the frontal end of the cover plate that is closed is adjusted to be aligned with a first end of the semiconductor die to be picked up, a position of the cover plate in the width direction is adjusted to be aligned with a position of the semiconductor die in the width direction, the semiconductor die is suctioned by the collet, the cover plate is caused to slide to sequentially open a suction opening from a first end side toward a second end side of the semiconductor die to be picked up, the dicing sheet is sequentially suctioned into the opened suction opening from the first end side toward the second end side of the semiconductor die to be picked up, thereby sequentially separating the dicing sheet from the semiconductor die to be picked up.

9. The die pickup apparatus according to claim 3, wherein the slider drive mechanism is configured to include:

a drive unit that is attached to a base body provided on an opposite side of the contact surface of the stage and that drives a first link member provided within the stage in a direction toward and away from the contact surface;

a piston provided within the stage and moves toward and away from the contact surface;

a stopper provided within the stage and that restricts the motion of the piston in the direction toward and away from the contact surface;

a spring that connects the first link member with the piston in the direction toward and away from the contact surface and that is compressed when the piston is brought into contact with the stopper;

a guide rail that is attached to the piston and to which the slider is slidably attached, the guide rail extending in a direction substantially in parallel with the contact surface and in which the suction opening extends; and a second link member that is rotatably attached to the piston, connects the slider with the first link member, and converts the motion of the first link member in the direction toward and away from the contact surface into the motion of the slider along the guide rail when the piston is brought into with the stopper.

10. A method of picking up semiconductor dies that are attached on a dicing sheet by means of a die pickup apparatus, comprising:

providing a die pickup apparatus, the die pickup apparatus comprising:

a stage comprising a contact surface that is brought into close contact with a first surface of the dicing sheet facing away from a second surface of the dicing sheet, the second surface being attached with the semiconductor dies and the stage having a suction opening that is provided on the contact surface, a cover plate that is provided for the stage such that a frontal end on a side for closing the suction opening and a rear end on a side for opening the cover plate freely extend upward from the contact surface and that slides along the contact surface so as to open and close the suction opening, and a collet that suctions the semiconductor die;

a positioning step of adjusting the frontal end of the cover plate that is closed to be aligned with a first end of the semiconductor die to be picked up, and adjusting a position of the cover plate in the width direction to be aligned with a position of the semiconductor die in the width direction; and a pick up step in which the semiconductor die is picked up by suctioning the semiconductor die to be picked up by the collet, causing the frontal end of the cover plate facing the side for closing the suction opening to extend upward from contact surface and the cover plate is caused to slide while pushing up the dicing sheet and the semiconductor die to form a gap between the suction opening and the frontal end of the cover plate, and subsequently causing the rear end of the cover plate facing the side for opening the cover plate to extend upward from the contact surface such that an upper surface of the cover plate is substantially in parallel with the contact surface, sliding the cover plate while pushing up the dicing sheet and the semiconductor die with the upper surface of the cover plate such that the suction opening is sequentially opened, and suctioning the dicing sheet sequentially into the opened suction opening.

11. The method of picking up semiconductor dies according to claim 10, wherein the die pickup apparatus is configured to include a stage vertical drive mechanism that moves the stage in a direction toward and away from the dicing sheet, and a wafer holder horizontal drive unit that moves a wafer holder along a plane of the dicing sheet, the wafer holder fixedly holding the dicing sheet to which the semiconductor die to be picked up is attached, and in the positioning step, the contact surface of the stage and the surface of the cover plate for pushing up the dicing sheet are closely brought into contact with the dicing sheet by the stage vertical drive mechanism, and a position of the semiconductor die to be picked up in a horizontal direction is adjusted by the wafer holder horizontal drive unit.

* * * * *